US 7,044,196 B2

(12) United States Patent
Shook et al.

(10) Patent No.: US 7,044,196 B2
(45) Date of Patent: May 16, 2006

(54) DECOUPLED SPRING-LOADED MOUNTING APPARATUS AND METHOD OF MANUFACTURING THEREOF

(75) Inventors: James Gill Shook, Santa Cruz, CA (US); James Lovette, Palo Alto, CA (US)

(73) Assignee: Cooligy,Inc, Mountain View, CA (US)

( * ) Notice: Subject to any disclaimer, the term of this patent is extended or adjusted under 35 U.S.C. 154(b) by 241 days.

(21) Appl. No.: 10/680,324

(22) Filed: Oct. 6, 2003

(65) Prior Publication Data
US 2004/0188065 A1    Sep. 30, 2004

Related U.S. Application Data

(60) Provisional application No. 60/444,269, filed on Jan. 31, 2003.

(51) Int. Cl.
F28F 7/00 (2006.01)
(52) U.S. Cl. .................. 165/80.3; 165/104.33
(58) Field of Classification Search ...... 165/80.3–80.5, 165/104.33; 257/719, 718; 361/698, 699
See application file for complete search history.

(56) References Cited

U.S. PATENT DOCUMENTS

| 596,062 | A | 12/1897 | Firey |
| 2,273,505 | A | 2/1942 | Florian |
| 3,654,988 | A | 4/1972 | Clayton, III |
| 3,817,321 | A | 6/1974 | von Cube et al. |
| 3,823,572 | A | 7/1974 | Cochran, Jr. |
| 3,929,154 | A | 12/1975 | Goodwin |
| 3,946,276 | A | * | 3/1976 | Braun et al. ................ 361/699 |
| 4,109,707 | A | 8/1978 | Wilson et al. |
| 4,138,996 | A | 2/1979 | Cartland |
| 4,194,559 | A | 3/1980 | Eastman |
| 4,203,448 | A | 5/1980 | Johnson et al. |
| 4,211,208 | A | 7/1980 | Lindner |
| 4,235,285 | A | 11/1980 | Johnson et al. |
| 4,248,295 | A | 2/1981 | Ernst et al. |
| 4,312,012 | A | 1/1982 | Frieser et al. |
| 4,345,267 | A | 8/1982 | Corman et al. |

(Continued)

FOREIGN PATENT DOCUMENTS

CN     97212126.9     3/1997

(Continued)

OTHER PUBLICATIONS

Stephen C. Jacobson et al., "Fused Quartz Substrates for Microchip Electrophoresis", Analytical Chemistry, Vo. 67, No. 13, Jul. 1, 1995, pp. 2059-2063.

(Continued)

*Primary Examiner*—Teresa J. Walberg
(74) *Attorney, Agent, or Firm*—Haverstock & Owens LLP

(57) ABSTRACT

A spring loaded mounting assembly secures a heat exchanger coupled to a heat source. The mounting assembly includes at least one support bracket positioned at one or more fixed locations with respect to the heat source, and a clip coupled to the support bracket and configured to maintain the heat exchanger in contact with the heat source. The mounting assembly also includes at least one bracket for securing a pump and heat rejector thereupon, wherein the heat exchanger and the pump are independently moveable with respect to one another. The heat rejector is preferably positioned above and alternatively positioned adjacent to the heat exchanger. The clip applies a downward force to the heat exchanger and consistently urges the heat exchanger in contact with the heat source irrespective of movements.

45 Claims, 5 Drawing Sheets

U.S. PATENT DOCUMENTS

| | | | |
|---|---|---|---|
| 4,450,472 A | 5/1984 | Tuckerman et al. | |
| 4,485,429 A | 11/1984 | Mittal | |
| 4,516,632 A | 5/1985 | Swift et al. | |
| 4,561,040 A | 12/1985 | Eastman et al. | |
| 4,567,505 A | 1/1986 | Pease et al. | |
| 4,573,067 A | 2/1986 | Tuckerman et al. | |
| 4,664,181 A | 5/1987 | Sumberg | |
| 4,716,494 A | 12/1987 | Bright et al. | |
| 4,758,926 A | 7/1988 | Herrell et al. | |
| 4,866,570 A | 9/1989 | Porter | |
| 4,868,712 A | 9/1989 | Woodman | |
| 4,894,709 A | 1/1990 | Phillips et al. | |
| 4,896,719 A | 1/1990 | O'Neill et al. | |
| 4,908,112 A | 3/1990 | Pace | |
| 4,938,280 A | 7/1990 | Clark | |
| 4,978,638 A | 12/1990 | Buller et al. | |
| 5,009,760 A | 4/1991 | Zare et al. | |
| 5,016,138 A | 5/1991 | Woodman | |
| 5,057,908 A | 10/1991 | Weber | |
| 5,058,627 A | 10/1991 | Brannen | |
| 5,070,040 A | 12/1991 | Pankove | |
| 5,083,194 A | 1/1992 | Bartilson | |
| 5,088,005 A | 2/1992 | Ciaccio | |
| 5,099,311 A | 3/1992 | Bonde et al. | |
| 5,099,910 A | 3/1992 | Walpole et al. | |
| 5,125,451 A | 6/1992 | Matthews | |
| 5,131,233 A | 7/1992 | Cray et al. | |
| 5,203,401 A | 4/1993 | Hamburgen et al. | |
| 5,218,515 A | 6/1993 | Bernhardt | |
| 5,232,047 A | 8/1993 | Matthews | |
| 5,239,200 A | 8/1993 | Messina et al. | |
| 5,263,251 A | 11/1993 | Matthews | |
| 5,274,920 A | 1/1994 | Matthews | |
| 5,309,319 A | 5/1994 | Messina | |
| 5,317,805 A | 6/1994 | Hoopman et al. | |
| 5,325,265 A | 6/1994 | Turlik et al. | |
| 5,380,956 A | 1/1995 | Loo et al. | |
| 5,383,340 A | 1/1995 | Larson et al. | |
| 5,397,919 A | 3/1995 | Tata et al. | |
| 5,427,174 A | 6/1995 | Lomolino, Sr. et al. | |
| 5,436,793 A | 7/1995 | Sanwo et al. | |
| 5,459,099 A | 10/1995 | Hsu | |
| 5,508,234 A | 4/1996 | Dusablon, Sr. et al. | |
| 5,514,832 A | 5/1996 | Dusablon, Sr. et al. | |
| 5,514,906 A | 5/1996 | Love et al. | |
| 5,544,696 A | 8/1996 | Leland | |
| 5,548,605 A | 8/1996 | Benett et al. | |
| 5,575,929 A | 11/1996 | Yu et al. | |
| 5,579,828 A | 12/1996 | Reed et al. | |
| 5,585,069 A | 12/1996 | Zanzucchi et al. | |
| 5,641,400 A | 6/1997 | Kaltenbach et al. | |
| 5,646,824 A * | 7/1997 | Ohashi et al. | 165/80.3 |
| 5,692,558 A | 12/1997 | Hamilton et al. | |
| 5,696,405 A | 12/1997 | Weld | |
| 5,703,536 A | 12/1997 | Davis et al. | |
| 5,704,416 A | 1/1998 | Larson et al. | |
| 5,727,618 A | 3/1998 | Mundinger et al. | |
| 5,731,954 A * | 3/1998 | Cheon | 165/80.4 |
| 5,763,951 A | 6/1998 | Hamilton et al. | |
| 5,774,779 A | 6/1998 | Tuchinskiy | |
| 5,800,690 A | 9/1998 | Chow et al. | |
| 5,801,442 A | 9/1998 | Hamilton et al. | |
| 5,835,345 A | 11/1998 | Staskus et al. | |
| 5,836,750 A | 11/1998 | Cabuz | |
| 5,858,188 A | 1/1999 | Soane et al. | |
| 5,863,708 A | 1/1999 | Zanzucchi et al. | |
| 5,869,004 A | 2/1999 | Parce et al. | |
| 5,870,823 A | 2/1999 | Bezama et al. | |
| 5,874,795 A | 2/1999 | Sakamoto | |
| 5,876,655 A | 3/1999 | Fisher | |
| 5,880,017 A | 3/1999 | Schwiebert et al. | |
| 5,880,524 A | 3/1999 | Xie | |
| 5,886,870 A | 3/1999 | Omori | |
| 5,901,037 A | 5/1999 | Hamilton et al. | |
| 5,936,192 A | 8/1999 | Tauchi | |
| 5,940,270 A | 8/1999 | Puckett | |
| 5,942,093 A | 8/1999 | Rakestraw et al. | |
| 5,964,092 A | 10/1999 | Tozuka et al. | |
| 5,965,001 A | 10/1999 | Chow et al. | |
| 5,965,813 A | 10/1999 | Wan et al. | |
| 5,978,220 A | 11/1999 | Frey et al. | |
| 5,997,713 A | 12/1999 | Beetz, Jr. et al. | |
| 5,998,240 A | 12/1999 | Hamilton et al. | |
| 6,007,309 A | 12/1999 | Hartley | |
| 6,010,316 A | 1/2000 | Haller et al. | |
| 6,013,164 A | 1/2000 | Paul et al. | |
| 6,014,312 A | 1/2000 | Schulz-Harder et al. | |
| 6,019,882 A | 2/2000 | Paul et al. | |
| 6,021,045 A | 2/2000 | Johnson | |
| 6,054,034 A | 4/2000 | Soane et al. | |
| 6,068,752 A | 5/2000 | Dubrow et al. | |
| 6,090,251 A | 7/2000 | Sundberg et al. | |
| 6,096,656 A | 8/2000 | Matzke et al. | |
| 6,100,541 A | 8/2000 | Nagle et al. | |
| 6,101,715 A | 8/2000 | Fuesser et al. | |
| 6,119,729 A | 9/2000 | Oberholzer et al. | |
| 6,126,723 A | 10/2000 | Drost et al. | |
| 6,129,145 A | 10/2000 | Yamamoto et al. | |
| 6,131,650 A | 10/2000 | North et al. | |
| 6,146,103 A | 11/2000 | Lee et al. | |
| 6,154,363 A | 11/2000 | Chang | |
| 6,159,353 A | 12/2000 | West et al. | |
| 6,166,907 A * | 12/2000 | Chien | 165/104.33 |
| 6,174,675 B1 | 1/2001 | Chow et al. | |
| 6,176,962 B1 | 1/2001 | Soane et al. | |
| 6,186,660 B1 | 2/2001 | Kopf-Sill et al. | |
| 6,210,986 B1 | 4/2001 | Arnold et al. | |
| 6,216,343 B1 | 4/2001 | Leland et al. | |
| 6,221,226 B1 | 4/2001 | Kopf-Sill | |
| 6,227,809 B1 | 5/2001 | Forster et al. | |
| 6,234,240 B1 | 5/2001 | Cheon | |
| 6,238,538 B1 | 5/2001 | Parce et al. | |
| 6,277,257 B1 | 8/2001 | Paul et al. | |
| 6,301,109 B1 | 10/2001 | Chu et al. | |
| 6,313,992 B1 | 11/2001 | Hildebrandt | |
| 6,317,326 B1 | 11/2001 | Vogel et al. | |
| 6,321,791 B1 | 11/2001 | Chow | |
| 6,322,753 B1 | 11/2001 | Lindberg et al. | |
| 6,324,058 B1 * | 11/2001 | Hsiao | 165/80.4 |
| 6,337,794 B1 | 1/2002 | Agonafer et al. | |
| 6,347,036 B1 | 2/2002 | Yeager et al. | |
| 6,351,384 B1 | 2/2002 | Darkoku et al. | |
| 6,381,813 B1 * | 5/2002 | Lai | 361/704 |
| 6,388,317 B1 | 5/2002 | Reese | |
| 6,397,932 B1 | 6/2002 | Calaman et al. | |
| 6,400,012 B1 | 6/2002 | Miller et al. | |
| 6,406,605 B1 | 6/2002 | Moles | |
| 6,415,860 B1 | 7/2002 | Kelly et al. | |
| 6,417,060 B1 | 7/2002 | Tavkhelidze et al. | |
| 6,424,531 B1 | 7/2002 | Bhatti et al. | |
| 6,443,222 B1 | 9/2002 | Yun et al. | |
| 6,444,461 B1 | 9/2002 | Knapp et al. | |
| 6,449,157 B1 | 9/2002 | Chu | |
| 6,449,162 B1 | 9/2002 | Corbin, Jr. et al. | |
| 6,457,515 B1 | 10/2002 | Vafai et al. | |
| 6,459,582 B1 | 10/2002 | Ali et al. | |
| 6,495,015 B1 | 12/2002 | Schoeniger et al. | |
| 6,496,371 B1 * | 12/2002 | Winkel et al. | 361/703 |
| 6,537,437 B1 | 3/2003 | Galambos et al. | |
| 6,543,521 B1 | 4/2003 | Sato et al. | |
| 6,553,253 B1 | 4/2003 | Chang | |
| 6,572,749 B1 | 6/2003 | Paul et al. | |
| 6,588,498 B1 | 7/2003 | Reysin et al. | |
| 6,591,625 B1 | 7/2003 | Simon | |

| | | |
|---|---|---|
| 6,632,655 B1 | 10/2003 | Mehta et al. |
| 6,728,102 B1* | 4/2004 | Ishikawa et al. ........ 165/104.33 |
| 2001/0004313 A1* | 6/2001 | Yamaoka ..................... 361/704 |
| 2001/0016985 A1 | 8/2001 | Insley et al. |
| 2001/0024820 A1 | 9/2001 | Mastromatteo et al. |
| 2001/0044155 A1 | 11/2001 | Paul et al. |
| 2001/0045270 A1 | 11/2001 | Bhatti et al. |
| 2001/0046703 A1 | 11/2001 | Burns et al. |
| 2001/0055714 A1 | 12/2001 | Cettour-Rose et al. |
| 2002/0011330 A1 | 1/2002 | Insley et al. |
| 2002/0075645 A1 | 6/2002 | Kitano et al. |
| 2002/0121105 A1 | 9/2002 | McCarthy, Jr. et al. |
| 2003/0121274 A1 | 7/2003 | Wightman |
| 2004/0040695 A1 | 3/2004 | Chesser et al. |
| 2004/0089008 A1 | 5/2004 | Tilton et al. |
| 2004/0125561 A1* | 7/2004 | Gwin et al. .................. 361/699 |
| 2004/0207986 A1* | 10/2004 | Rubenstein ................. 165/80.3 |

FOREIGN PATENT DOCUMENTS

| | | |
|---|---|---|
| JP | 10-99592 | 4/1998 |
| JP | 2000-277540 | 10/2000 |
| JP | 2001-326311 | 11/2001 |

OTHER PUBLICATIONS

Kendra V. Sharp et al., "Liquid Flows in Microchannels", 2002, vol. 6, pp. 6-1 to 6-38.

Shuchi Shoji et al., "Microflow devices and systems", J. Microcech. Microeng. 4 (1994), pp. 157-171, printed in the U.K.

Angela Rasmussen et al., "Fabrication Techniques to Realize CMOS-Compatible Microfluidic Microchannels", Journal of Microelectromechanical, Vo. 10, No. 2, Jun. 2001, pp. 286-297.

J. H. Wang et al., "Thermal-Hydraulic Characteristic of Micro Heat Exchangers", 1991, DSC-vol. 32, Micromechanical Sensors, Actuators, and Systems, pp. 331-339.

Gad Hetsroni et al., "Nonuniform Temperature Distribution in Electronic Devices Cooled by Flow in Parallel Microchannels", IEEE Transactions on Components and Packaging Technologies, Mar. 2001, vol. 24, No. 1, pp. 16-23.

X. F. Peng et al., "Heat Transfer Characteristics of Water Flowing through Microchannels", Experimental Heat Transfer An International Journal, vol. 7, No. 4, Oct.-Dec. 1994, pp. 265-283.

Linan Jiang et al., "Forced Convection Boiling in a Microchannel Heat Sink", Journal of Microelectromechanical Systems, vol. 10, No. 1, Mar. 2001, pp. 80-87.

Muhammad M. Rahman et al., "Experimental Measurements of Fluid Flow and Heat Transfer in Microchannel Cooling Passages in a Chip Substrate", 1993, EEP-vol. 4-2, Advances in Electronic Packages, pp. 685-692.

X. F. Peng et al., "Forced convection and flow boiling heat transfer for liquid flowing through Microchannels", 1993, Int. J. Heat Mass Transfer, vol. 36, No. 14, pp. 3421-3427.

Lung-Jieh Yang et al., "A Micro Fluidic System of Micro Channels with On-Site Sensors by Silicon Bulk Micromaching", Sep. 1999, Microfluidic Devices and Systems II, vol. 3877, pp. 267-272.

G. Mohiuddin Mala et al., "Heat transfer and fluid flow in microchannels", 1997, Int. J. Mass transfer, vol. 40, No. 13, pp. 3079-3088, printed in Great Britain.

J. M. Cuta et al., "Fabrication and Testing of Micro-Channel Heat Exchangers", SPIE Microlithography and Metrology in Micromaching, vol. 2640, 1995, pp. 152-160.

Linan Jiang et al., "A Micro-Channel Heat Sink with Integrated Temperature Sensors for Phase Transition Study", 1999, 12th IEEE International Conference on Micro Electro Mechanical Systems, pp. 159-164.

Linan Jiang et al., "Fabrication and characterization of a microsystem for a micro-scale heat transfer study", J. Micromech. Microeng. 9 (1999) pp. 422-428, printed in the U.K.

M. B. Bowers et al., "High flux boiling in low flow rate, low pressure drop mini-channel and micro-channel heat sinks", 1994, Int. J. Heat Mass Transfer, vol. 37, No. 2, pp. 321-332.

Yongendra Joshi, "Heat out of small packages", Dec. 2001, Mechanical Engineer, pp. 56-58.

A. Rostami et al., "Liquid Flow and Heat Transfer in Microchannels: a Review", 2000, Heat and Technology, vol. 18, No. 2, pp. 59-68.

Lian Zhang et al., "Measurements and Modeling of Two-Phase Flow in Microchannels with Nearly Constant Heat Flux Boundary Conditions", Journal of Microelectromechanical Systems, vol. 11, No. 1, Feb. 2002, pp. 12-19.

Muhammad Mustafizur Rahman, "Measurements of Heat Transfer in Microchannel Heat Sinks", Int. Comm. Heat Mass Transfer, vol. 27, No. 4, May 2000, pp. 495-506.

Issam Mudawar et al., "Enhancement of Critical Heat Flux from High Power Microelectronic Heat Sources in a Flow Channel", Journal of Electronic Packaging, Sep. 1990, vol. 112, pp. 241-248.

Nelson Kuan, "Experimental Evaluation of Micro Heat Exchangers Fabricated in Silicon", 1996, HTD-vol. 331, National Heat Transfer Conference, vol. 9, pp. 131-136.

E. W. Kreutz et al., "Simulation of micro-channel heat sinks for optoelectronic microsystems", Microelectronics Journal 31(2000) pp. 787-790.

J. C. Y. Koh et al., "Heat Transfer of Microstructure for Integrated Circuits", 1986, Int. Comm. Heat Mass Transfer, vol. 13, pp. 89-98.

Snezana Konecni et al., "Convection Cooling of Microelectronic Chips", 1992, InterSociety Conference on Thermal Phenomena, pp. 138-144.

Michael B. Kleiner et al., "High Performance Forced Air Cooling Scheme Employing Microchannel Heat Exchangers", 1995, IEEE Transactions on Components, Packaging, and Manufacturing Technology-Part A, vol. 18, No. 4, pp. 795-804.

Jerry K. Keska Ph. D. et al., "An Experimental Study on an Enhanced Microchannel Heat Sink for Microelectronics Applications", EEP-vol. 26-2, Advances in Electronic Packaging, 1999, vol. 2, pp. 1235-1259.

Shung-Wen Kang et al., "The Performance Test and Analysis of Silicon-Based Microchannel Heat Sink", Jul. 1999, Terahertz and Gigahertz Photonics, vol. 3795, pp. 259-270.

Joseph C. Tramontana, "Semiconductor Laser Body Heat Sink", Xerox Disclosure Journal, vol. 10, No. 6, Nov./Dec. 1985, pp. 379-381.

Sarah Arulanandam et al., "Liquid transport in rectangular microchannels by electroosmotic pumping", Colloid and Surfaces A: Physicochemical and Engineering Aspects 161 (2000), pp. 89-102.

Jeffery D. Barner et al., "Thermal Ink Jet Print Head Carriage with Integral Liquid Cooling Capabilities", Xerox Disclosure Journal-vol. 21, No. 1, Jan./Feb. 1996, pp. 33-34.

"Autonomous displacement of a solution in a microchannel by another solution", Research Disclosure, Jun. 2001, pp. 1046-1047.

John M. Waldvogel, "Aluminum Silicon Carbide Phase Change Heat Spreader", Motorola, Jun. 1999, Technical Developments, pp. 226-230.

James P. Slupe et al., "An idea for maintaining a stable thermal environment for electronic devices", Research Disclosure, Aug. 2001, p. 1312.

John M. Waldvogel, "A Heat Transfer Enhancement Method for Forced Convection Bonded-Fin Heatsinks", Motorola, Dec. 1997, Technical Developments, pp. 158-159.

"Thin Heat Pipe for Cooling Components on Printed Circuit Boards", IBM Technical Disclosure Bulletin, vol. 34, No. 7B, Dec. 1991, pp. 321-322.

R. C. Chu et al., "Process for Nucleate Boiling Enhancement", IBM Technical Disclosure Bulletin, vol. 18, No. 7, Dec. 1975, p. 2227.

J. Riseman, "Structure for Cooling by Nucleate Boiling", IBM Technical Disclosure Bulletin, vol. 18, No. 11, Apr. 1976, p. 3700.

"Integrally Grooved Semiconductor Chip and Heat Sink", Oct. 1971, IBM Technical Disclosure Bulletin, vol. 14, No. 5, p. 1425.

"Enhanced Cooling of Thermal Conduction Module", IBM Technical Disclosure Bulletin, vol. 30, No. 5, Oct. 1987, p. 426.

"Heat Exchanger Modules for Data Process with Valves Operated by Pressure form Cooling Water Pump", IBM Technical Disclosure Bulletin, vol. 30, No. 5, Oct. 1987, p. 419.

"Cold Plate for Thermal Conduction Module with Inlet for Cooling Water Near Highest Power Chips", IBM Technical Disclosure Bulletin, vol. 30, No. 5, Oct. 1987, p. 413.

"Circuit Module Cooling with Coaxial Bellow Providing Inlet, Outlet and Redundant Connections to Water-Cooled Element", IBM Technical Bulletin, vol. 30, No. 5, Oct. 1987, pp. 345-347.

"Piping System with Valves Controlled by Processor for Heating Circuit Modules in a Selected Temperature Profile for Sealing Integrity Test Under Temperature Stress", IBM Technical Disclosure Bulletin, vol. 30, No. 5, Oct. 1987, p. 336.

"Cooling System for Chip Carrier on Card", IBM Technical Disclosure Bulletin, vol. 31, No. 4, Sep. 1988, pp. 39-40.

"Chip Cooling Device", IBM Technical Disclosure Bulletin, vol. 30, No. 9, Feb. 1988, pp. 435-436.

W. E. Ahearn et al., "Silicon Heat Sink Method to Control Integrated Circuit Chip Operating Temperatures", IBM Technical Disclosure Bulletin, vol. 21, No. 8, Jan. 1979, pp. 3378-3380.

N. P. Bailey et al., "Cooling Device for Controlled Rectifier", IBM Technical Disclosure Bulletin, vol. 21, No. 11, Apr. 1979, pp. 4609-4610.

W. J. Kleinfelder et al., "Liquid-Filled Bellows Heat Sink", IBM Technical Disclosure Bulletin, vol. 21, No. 10, Mar. 1979, pp. 4125-4126.

R. P. Chrisfield et al., "Distributed Power/Thermal Control", IBM Technical Disclosure Bulletin, vol. 22, No. 3, Aug. 1979, pp. 1131-1132.

A. J. Arnold et al., "Heat Sink Design for Cooling Modules in a Forced Air Environment", IBM Technical Disclosure Bulletin, vol. 22, No. 6, Nov. 1979, pp. 2297-2298.

A. J. Arnold, "Structure for the Removal of Heat from an Integrated Circuit Module", IBM Technical Disclosure Bulletin, vol. 22, No. 6, Nov. 1979, pp. 2294-2296.

U. P. Hwang et al., "Cold Plate for Thermal Conduction Module with Improved Flow Pattern and Flexible Base", IBM Technical Disclosure Bulletin, vol. 25, No. 9, Feb. 1983, p. 4517.

K. C. Gallagher et al., "Cooling System for Data Processor with Flow Restricter in Secondary Loop to Limit Bypass-Cooling Water Flow", IBM Technical Disclosure Bulletin, vol. 26, No. 5, Oct. 1983, p. 2658.

R. C. Chu et al., "Silicon Heat Sink for Semiconductor Chip", IBM Technical Disclosure Bulletin, vol. 24, No. 11A, Apr. 1982, p. 5743.

J. M. Eldridge et al., "Heat-Pipe Vapor Cooling Etched Silicon Structure", IBM Technical Disclosure Bulletin, vol. 25, No. 8, Jan. 1983, pp. 4118-4119.

J. R. Skobern, "Thermoelectrically Cooled Module", IBM Technical Disclose Bulletin, vol. 27, No. 1A, Jun. 1984, p. 30.

M. J. Brady et al., "Etched Silicon Integrated Circuit Heat Sink", IBM Technical Disclosure Bulletin, vol. 27, No. 1B, Jun. 1984, p. 627.

H. D. Edmonds et al., "Heat Exchange Element for Semiconductor Device Cooling", IBM Technical Disclosure Bulletin, vol. 23, No. 3, Aug. 1980, p. 1057.

R. W. Noth, "Heat Transfer from Silicon Chips and Wafers", IBM Technical Disclosure Bulletin, vol. 17, No. 12, May 1975, p. 3544.

"Forced Boiling Cooling System with Jet Enhancement for Crititical Heat Flux Extension", IBM Technical Disclosure Bulletin, vol. 39, No. 10, Oct. 1996, p. 143.

"Miniature Heat Exchanger for Corrosive Media", IBM Technical Disclosure Bulletin, vol. 38, No. 01, Jan. 1995, pp. 55-56.

"Self-Contained Active Heat Dissipation Device", IBM Technical Disclosure Bulletin vol. 39, No. 04, Apr. 1996, pp. 115-116.

C. J. Keller et al., "Jet Cooling Cup for Cooling Semiconductor Devices", IBM Technical Bulletin, vol. 20, No. 9, Feb. 1978, pp. 3575-3576.

B. J. Ronkese, "Centerless Ceramic Package with Directly Connected Heat Sink", IBM Technical Disclosure Bulletin, vol. 20, No. 9, Feb. 1978, p. 3577-3578.

K. S. Sachar, "Liquid Jet Cooling of Integrated Circuit Chips", vol. 20, No. 9, Feb. 1978, pp. 3727-3728.

A. H. Johnson, "Device Cooling", IBM Technical Disclosure Bulletin, vol. 20, No. 10, Mar. 1978, pp. 3919-3920.

A. L. Pacuzzo et al., "Integrated Circuit Module Package Cooling Structure", IBM Technical Disclosure Bulletin, vol. 20, No. 10, Mar. 1978, pp. 3898-3899.

R. D. Durand et al., "Flexible Thermal Conductor for Electronic Module", IBM Technical Disclosure Bulletin, vol. 20, No. 11A, Apr. 1978, p. 4343.

D. Balderes et al., "Liquid Cooling of a Multichip Module Package", IBM Technical Disclosure Bulletin, vol. 20, No. 11A, Apr. 1978, pp. 4336-4337.

J. A. Dorler et al., "Temperature Triggerable Fluid Coupling System for cooling Semiconductor Dies", IBM Technical Disclosure Bulletin, vol. 20, No. 11A, Apr. 1978, pp. 4386-4388.

V. W. Antonetti et al., "Integrated Module Heat Exchanger", IBM Technical Disclosure Bulletin, vol. 20, No. 11A, Apr. 1978, p. 4498.

P. Hwang et al., "Conduction Cooling Module", IBM Technical Disclosure Bulletin, vol. 20, No. 11A, Apr. 1978, pp. 4334-4335.

A. J. Arnold, "Electronic Packaging Structure", IBM Technical Disclosure Bulletin, vol. 20, No. 11B, Apr. 1978, pp. 4820-4822.

V. Y. Doo et al., "High Performance Package for Memory", IBM Technical Disclosure Bulletin, vol. 21, No. 2, Jul. 1978, pp. 585-586.

"Multi-Chip Package with Cooling by a Spreader Plate in Contact with a Chip having Cylindrical Holes Mating with an Inverse Frame Providing Water Flow Within its Pins", IBM Technical Disclosure Bulletin, vol. 31, No. 5, Oct. 1988, pp. 141-142.

J. Landrock et al., "Cooling System for Semiconductor Chips", IBM Technical Disclosure Bulletin, vol. 23, No. 4, Sep. 1980, p. 1483.

E. P. Damm, Jr., "Convection Cooling Apparatus", IBM Technical Disclosure Bulletin, vol. 20, No. 7, Dec. 1977, pp. 2755-2756.

"Circuit Package with Circulating Boiling Liquid and Local Heat Exchanger to Limit Vapor in Coolant Outlet", IBM Technical Disclosure Bulletin, vol. 31, No. 12 May 1989, p. 34.

"Circuit Module Cooling with Multiple Pistons Contacting a Heat Spreader/Electrical Buffer Plate in Contact with Chip", IBM Technical Disclosure Bulletin, vol. 31, No. 12, May 1989, p. 5-7.

"TCM-LIKE Circuit Module with Local Heat Sink Resting on Chip and Chip Separated From Coolant by Bellows with Pins and Deflector Plate Attached to Local Heat Sink and Extending Above Bellows into Region of Coolant Flow", IBM Technical Disclosure Bulletin, vol. 31, No. 11, pp. 305-306.

"Water-Cooled Circuit Module with Grooves Forming Water Passages Near Heat-Producing Devices", IBM Technical Disclosure Bulletin, vol. 31, No. 12, May 1989, pp. 49-50.

"Cold Plate for Thermal conduction Module with Only Peripheral Mounting bolts, Large Surface Area Fin Inserts and Reduced Water Flow and Thermal Resistances", IBM Technical Disclosure Bulletin, vol. 31, No. 12, May 1989, p. 59.

"Thermal Control Hardware for Accelerated Run-In Testing of Multi-Chip Modules", IBM Technical Disclosure Bulletin, vol. 32, No. 5A, Oct. 1989, p. 129-130.

"Means of Removing More Heat From a TCM (Or Other Liquid-Cooled Logic Package) By Reducing the Coolant Temperature", IBM Technical Disclosure Bulletin, vol. 32 No. 5A, Oct. 1989, pp. 153-154.

E. G. Loeffel et al., "Liquid Cooled Module with Compliant Membrane", IBM Technical Disclosure Bulletin, vol. 20, No. 2, Jul. 1977, pp. 673-674.

V. Y. Doo et al., "Method of Effective Cooling of a High Power Silicon Chip", IBM Technical Disclosure Bulletin, vol. 20, No. 4, Sep. 1977, p. 1436-1437.

V. Y. Doo et al., Semiconductor Chip Cooling Package, IBM Technical Disclosure Bulletin, vol. 20, No. 4, Sep. 1977, pp. 1440-1441.

"Heat Sink Fabrication Method", IBM Technical Disclosre Bulletin, vol. 27, No. 10A, Mar. 1985, pp. 5656-5657.

"Thermal Conduction Module with Liquid Dielectric and Pistons with Surface Treatment for Enhanced Nucleate Boiling", IBM Technical Disclosure Bulletin, vol. 27, No. 12, May 1985, p. 6904.

"Pin Fin Array Heat Pipe Apparatus", IBM Technical Disclosure Bulletin, vol. 37, No. 09, Sep. 1994, p. 171.

Youngcheol Joo et al., "Fabrication of Monolithic Microchannels for IC Chip Cooling", 1995, IEEE Micro Electro Mechanical Systems, pp. 362-367.

Jaisree Moorthy et al., *Active control of electroosmotic flow in microchannels using light*, Jan. 26, 2001, Sensors and Actuators B.75, pp. 223-229.

Andreas Manz et al., *Electroosmotic pumping and electrophoretic separations for miniaturized chemical analysis systems*, Sep. 16, 1994, J.Micromech. Microeng. 4 (1994), pp. 257-265, printed in the U.K.

E. B. Cummings et al., *Irrotationality of uniform electroosmosis*, Sep. 1999, Part of the SPIE Conference on Microfluidic Devices and Systems II, SPIE vol. 3877, pp. 180-189.

Stephen C. Jacobson et al., *Fused Quartz Substrates for Microchip Electrophoresis*, Jul. 1, 1995, Analytical Chemistry, vol. 67, No. 13, pp. 2059-2063.

Haim H. Bau, *Optimization of conduits' shape in micro heat exchangers*, Dec. 10, 1997, International Journal of Heat and Mass Transfer 41 (1998), pp. 2717-2723.

V. K. Dwivedi et al., *Fabrication of very smooth walls and bottoms of silicon microchannels for heat dissipation of semiconductor devices*, Jan. 25, 2000, Microelectronics Journal 31 (2000), pp. 405-410.

M. B. Bowers et al.,, *Two-Phase Electronic Cooling Using Mini-Channel and Micro-Channel Heat Sinks: Part 2-Flow Rate and Pressure Drop Constraints*, Dec. 1994, Journal of Electronic Packaging 116, pp. 298-305.

Meint J. de Boer et al., *Micromachining of Buried Micro Channels in Silicon*, Mar. 2000, Journal of Microelectromechanical systems, vol. 9, No. 1, pp. 94-103.

S.B. Choi et al., *Fluid Flow and Heat Transfer in Microtubes*, 1991, DSC-vol. 32, Micromechanical sensors, Actuators, and Systems, ASME 1991, pp. 123-134.

S. F. Choquette, M. Faghri et al., *Optimum Design of Microchannel Heat Sinks*, 1996, DSC-vol. 59, Microelectromechanical Systems (MEMS), ASME 1996, pp. 115-126.

David Copeland et al., *Manifold Microchannel Heat Sinks: Theory and Experiment*, 1995, EEP-vol. 10-2, Advances in Electronic Packaging ASME 1995, pp. 829-835.

J. M. Cuta et al., *Forced Convection Heat Transfer in Parallel Channel Array Microchannel Heat Exchanger*, 1996, PID-vol. 27 HTD-vol. 338, Advances in Energy efficiency, Heat/Mass Transfer Enhancement, ASME 1996, pp. 17-23.

K. Fushinobu et al., *Heat Generation and Transport in Sub-Micron Semiconductor Devices*, 1993, HTD-vol. 253, Heat Transfer on the Microscale, ASME 1993, pp. 21-28.

Charlotte Gillot et al., *Integrated Micro Heat Sink for Power Multichip Module*, Sep. 3, 1999, IEEE Transactions on Industry Applications, vol. 36. No. 1. Jan./Feb. 2000, pp. 217-221.

John Gooding, *Microchannel heat exchangers—a review*, SPIE vol. 1997 High Heat Flux Engineering II (1993), pp. 66-82.

Koichiro Kawano et al., *Micro Channel Heat Exhanger for Cooling Electrical Equipment*, HTD-vol. 361-3/PID-vol. 3, Proceeding of the ASME Heat Transfer Division—vol. 3, ASME 1998, pp. 173-188.

Chad Harris et al., *Design and Fabrication of a Cross Flow Micro Heat Exchanger*, Dec. 2000, Journal of Microelectromechanical Systems, vol. 9, No. 4, pp. 502-508.

George M. Harpole et al., *Micro-Channel Heat Exchanger Optimization*, 1991, Seventh IEEE Semi-Therm Symposium, pp. 59-63.

Pei-Xue Jiang et al., *Thermal-hydraulic performance of small scale micro-channel and prous-media heat-exchangers,* 2001, International Journal of Heat and Mass Transfer 44 (2001), pp. 1039-1051.

X.N. Jiang et al., *Laminar Flow Through Microchannels Used for Microscale Cooling Systems,* 1997, IEEE/CPMT Electronic Packaging Technology Conference, pp. 119-122, Singapore.

David Bazeley Tuckerman, *Heat-Transfer Microstructures for Integrated Circuits,* Feb. 1984, pp. ii-xix, pp. 1-141.

M Esashi, *Silicon micromachining for integrated microsystems,* 1996, Vacuum/vol. 47/Nos. 6-8/pp. 469-474.

T.S. Raviguruajan et al., *Effects of Heat Flux on Two-Phase Flow characteristics of Refrigerant Flows in a Micro-Channel Heat Exchanger,* HTD-vol. 329, National Heat Transfer Conference, vol. 7, ASME 1996, pp. 167-178.

T.S. Ravigruruajan et al., *Single-Phase Flow Thermal Performance Characteristics of a Parallel Micro-Channel Heat Exchanger,* 1996, HTD-vol. 329, National Heat Transfer Conference, vol. 7, ASME 1996, pp. 157-166.

T.S. Ravigururajan et al., *Liquid Flow Characteristics in a Diamond-Pattern Micro-Heat-Exchanger,* DSC-vol. 59 Microelectromechanical Systems (IMEMS), ASME 1996, pp. 159-166.

T.S. Raviguruajan, *Impact of Channel Geometry on Two-Phase Flow Heat Transfer Characteristics of Refrigerants in Microchannel Heat Exchangers,* May 1998, Journal of Heat Transfer, vol. 120, pp. 485-491.

J. Pfahler et al., *Liquid Transport in Micron and Submicron Channels,* Mar. 1990, Sensors and Actuators, A21-A23 (1990), pp. 431-434.

Kenneth Pettigrew et al., *Performance of a MEMS based Micro Capillary Pumped Loop for Chip-Level Temperature Control,* 2001, The 14th IEEE International Conference on Micro Electro Mechanical Systems, pp. 427-430.

C. Perret et al., *Microchannel integrated heat sinks in silicon technology,* Oct. 12-15, 1998, The 1998 IEEE Industry Applications Conference, pp. 1051-1055.

X.F. Peng et al., *Convective heat transfer and flow friction for water flow in microchannel structures,* 1996, Int. J. Heat Mass Transfer, vol. 39, No. 12, pp. 2599-2608, printed in Great Britain.

X.F. Peng et al., *Experimental investigation of heat transfer in flat plates with rectangular microchannels,* 1994, Int. J. Heat Mass Transfer, vol. 38, No. 1, pp. 127-137, printed in Great Britain.

X.F. Peng et al., *Cooling Characteristics with Microchanneled Structures,* 1994, Enhanced Heat Transfer, vol. 1, No. 4, pp. 315-326, printed in the United States of America.

Yoichi Murakami et al., *Parametric Optimization of Multichananneled Heat Sinks for VLSI Chip Cooling,* Mar. 2002, IEEE Transaction on Components and Packaging Technologies, vol. 24, No. 1, pp. 2-9.

D. Mundinger et al., *High average power 2-D laser diode arrays or silicon microchannel coolers,* CLEO '89/Friday Morning/404.

L.J. Missaggia et al., *Microchannel Heat Sinks for Two-Dimensional High-Power-Density Diode Laser Arrays,* 1989, IEEE Journal of Quantum Electronics, vol. 25, No. 9, Sep. 1989, pp. 1989-1992.

M.J. Marongiu et al., *Enhancement of Multichip Modules (MCMs) Cooling by Incorporating MicroHeatPipes and Other High Thermal Conductivity Materials into Microchannel Heat Sinks,* 1998, Electronic Components and Technology Conference, pp. 45-50.

C.R. Friedrich et al., *Micro heat exchangers fabricated by diamond machining,* Jan. 1994, Precision Engineering, vol. 16, No. 1, pp. 56-59.

Mali Mahalingam, *Thermal Management in Semiconductor Device Packaging,* 1985, Proceedings of the IEEE, vol. 73, No. 9, Sep. 1985, pp. 1396-1404.

T.M. Adams et al., *An experimental investigation of single-phase forced convection in microchannels,* 1997, Int. J. Heat Mass Transfer, vol. 41, Nos. 6-7, pp. 851-857, Printed in Great Britain.

T.M. Adams et al., *Applicability of traditional turbulent single-phase forced convection correlations to non-circular micrhchannels,* 1999, Int. J. Heat and Transfer 42 (1999) pp. 4411-4415.

Bassam Badran et al., *Experimental Results for Low-Temperature Silicon Micromachined Micro Heat Pipe Arrays Using Water and Methanol as Working Fluids,* May 31, 1997, Experimental Heat Transfer, 10: pp. 253-272.

D. Jed Harrison et al., *Electroosmotic Pumping Within A Chemical Sensor System Integrated on Silicon,* Session C9 Chemical Sensors and Systems for Liquids, Jun. 26, 1991, pp. 792-795.

Kurt Seller et al., *Electroosmotic Pumping and Valveless Control of Fluid Flow within a Manifold of Capillaries on a Glass Chip,* 1994, Analytical Chemistry, vol. 66, No. 20, Oct. 15, 1994, pp. 3485-3491.

Philip H. Paul et al., *Electrokinetic Generation of High Pressures Using Porous Microstructures,* 1998, Micro-Total Analysis Systems, pp. 49-52.

Gh. Mohiuddin Mala et al., *Flow characteristics of water through a microchannel between two parallel plates with electrokinetic effects,* 1997, Int. J. Heat and Fluid Flow, vol. 18, No. 5, pp. 489-496.

W.E. Morf et al., *Partial electroosmotic pumping in complex capillary systems Part 1: Principles and general theoretical approach,* Oct. 16, 2000, Sensors and Actuators B 72 (2001), pp. 266-272.

M. Esashi, *Silicon micromachining and micromachines,* Sep. 1, 1993, Wear, vol. 168, No. 1-2, (1993), pp. 181-187.

Stephanus Buttgenbach et al., *Microflow devices for miniaturized chemical analysis systems,* Nov. 4-5, 1998, SPIE-Chemical Microsensors and Applications, vol. 3539, pp. 51-61.

Sarah Arunlanandam et al., *Liquid transport in rectangular microchannels by electroosmotic pumping,* 2000, Colloids and Surfaces A: Physicochemical and Engineering Aspects vol. 161 (2000), pp. 89-102.

Linan Jiang et al., *Closed-Loop Electroosmotic Microchannel Cooling System for VLSI Circuits,* Mechanical Engineering Dept. Stanford University, pp. 1-27.

Susan L. R. Barker et al., *Fabrication, Derivatization and Applications of Plastic Microfluidic Devices,* Proceedings of SPIE, vol. 4205. Nov. 5-8, 2000, pp. 112-118.

Timothy E. McKnight et al., *Electroosmotically Induced Hydraulic Pumping with Integrated Electrodes on Microfluidic Devices,* 2001, Anal. Chem., vol. 73, pp. 4045-4049.

Chris Bourne, *Cool Chips plc Receives Nanotech Manufacturing Patent,* Jul. 31, 2002, pp. 1-2.

Frank Wagner et al., *Electroosmotic Flow Control in Micro Channels Produced by Scanning Excimer Laser Ablation,* 2000, Proceedings of SPIE vol. 4088, Jun. 14-16, 2000, pp. 337-340.

H. A. Goodman, *Data Processor Cooling With Connection To Maintain Flow Through Standby Pump,* Dec. 1983, IBM Technical Disclosure Bulletin, vol. 26, No. 7A, p. 3325.
*Electroerosion Micropump,* May 1990, IBM Technical Disclosure Bulletin, vol. 32, No. 12, pp. 342-343.
Shulin Zeng et al., *Fabrication and Characterization of Electrokinetic Micro Pumps,* 2000 Inter Society Conference on Thermal Phenomena, pp. 31-35.
A. Manz et al., *Integrated Electoosmotic Pumps and Flow Manifolds for Total Chemical Analysis System,* 1991, Inter. Conf. on Solid-State Sensors and Actuators, pp. 939-941.
O. T. Guenat et al., *Partial electroosmotic pumping in complex capillary systems Part: 2 Fabrication and application of a micro total analysis system suited for continuous volumetric nanotitrations,* Oct. 16, 2000, Sensors and Actuators B 72 (2001) pp. 273-282.
J. G. Sunderland, *Electrokinetic dewatering and thickening. I. Introduction and historical review of electrokinetic applications,* Sep. 1987, Journal of Applied Electrochemistry vol. 17, No. 5, pp. 889-898.
J. C. Rife et al., *Acousto- and electroosmotic microfluidic controllers,* 1998, Microfluidic Devices and Systems, vol. 3515, pp. 125-135.
Pumendu K Dasgupta et al., *Electroosmosis: A Reliable Fluid Propulsion System for Flow Injection Analysis,* 1994, Anal. Chem., vol. 66, No. 11, pp. 1792-1798.
Ray Beach et al., *Modular Microchannel Cooled Heatsinks for High Average Power Laser Diode Arrays,* Apr. 1992, IEEE Journal of Quantum Electronics, vol. 28, No. 4, pp. 966-976.
Roy W. Knight et al., *Optimal Thermal Design of Air cooled Forced Convection finned Heat Sinks—Experimental Verification,* Oct. 1992, IEEE Transactions on Components, Hybrids, and Manufacturing Technology, vol. 15, No. 5, pp. 754-760.
Y. Zhuang et al., *Experimental study on local heat transfer with liquid impingement flow in two-dimensional microchannels,* 1997, Int. J. Heat Mass Transfer, vol. 40, No. 17, pp. 4055-4059.
D. Yu et al., *An Experimental and Theoretical Investigation of Fluid Flow and Heat Transfer in Microtube,* 1995, ASME / JSME Thermal Engineering Conference, vol. 1, pp. 523-530.
Xiaoqing Yin et al., *Micro Heat Exchangers Consisting of Pin Arrays,* 1997, Journal of Electronic Packaging Mar. 1997, vol. 119, pp. 51-57.
X. Yin et al., *Uniform Channel Micro Heat Exchangers,* 1997, Journal of Electronic Packaging Jun. 1997, vol. 119, No. 2, pp. 89-94.
Chun Yang et al., *Modeling forced liquid convection in rectangular microchannels with electrokinetic effect,* 1998, International Journal of Heat and Mass Transfer 41 (1998), pp. 4229-4249.

Arel Weisberg et al., *Analysis of microchannels for integrated cooling,* 1992, Int. J. Heat Mass Transfer, vol. 35, No. 10, pp. 2465-2473.
Roger S. Stanley et al., *Two-Phase Flow in Microchannels,* 1997, DSE-vol. 62/HTD-vol. 354, MEMS, pp. 143-152.
B. X. Wang et al., *Experimental investigation on liquid forced-convection heat transfer through microchannels,* 1994, Int. J. Heat Mass Transfer, vol. 37, Suppl. 1, pp. 73-82.
Kambiz Vafai et al., *Analysis of two-layered micro-channel heat sink concept in electronic cooling,* 1999, Int. J. Heat Mass Transfer, 42 (1999), pp. 2287-2297.
Gokturk Tune et al., *Heat transfer in rectangular microchannels,* 2002, Int. J. Heat Mass Transfer, 45 (2002), pp. 765-773.
D. B. Tuckerman et al., *High-Performance Heat Sinking for VLSI,* 1981, IEEE Electron Device Letters, vol. EDL-2, No. 5, pp. 126-129.
Bengt Sunden et al., *An Overview of Fabrication Methods and Fluid Flow and Heat Transfer Characteristics of Micro Channels,* pp. 3-23.
David S. Shen et al., *Micro Heat Spreader Enhance Heat Transfer in MCMs,* 1995, IEEE Multi-Chip Module Conference, pp. 189-194.
S. Sasaki et al., *Optimal Structure for Microgrooved Cooling Fin for High-Power LSI Devices,* Electronic Letters, Dec. 4, 1986, vol. 22, No. 25.
Vijay K. Samalam, *Convective Heat Transfer in Microchannels,* Sep. 1989, Journal of Electronic Materials, vol. 18, No. 5, pp. 611-617.
Sanjay K. Roy et al., *A Very High Heat Flux Microchannel Heat Exchanger for Cooling of Semiconductor Laser Diode Arrays,* 1996, IEEE Transactions on components, packaging, and manufacturing technology-part B, vol. 19, No. 2, pp. 444-451.
Charlotte Gillot et al., *Integrated Single and Two-Phase Micro Heat Sinks Under 1GBT Chips,* IEEE Transactions on Components and Packaging Technology, vol. 22 No. 3, Sep. 1999, pp. 384-389.
X.F. Peng et al., "Enhancing the Critical Heat Flux Using Microchanneled Surfaces", Enhanced Heat Transfer, 1998, vol. 5 pp. 165-176.
H. Krumm "Chip Cooling", IBM Technical Disclosure Bulletin, vol. 20, No. 7, Dec. 1977, p. 2728.
Jae-Mo Koo et al., "Modeling of Two-Phase Microchannel Heat Sinks for VLSI Chips", Mech. Eng. Depart. of Stanford University, pp. 422-426.

* cited by examiner

DECOUPLED SPRING-LOADED MOUNTING APPARATUS AND METHOD OF MANUFACTURING THEREOF

RELATED APPLICATION

This Patent Application claims priority under 35 U.S.C. 119(e) of the co-pending U.S. Provisional Patent Application, Ser. No. 60/444,269 filed Jan. 31, 2003, and entitled "REMEDIES FOR FREEZING IN CLOSED-LOOP LIQUID COOLING FOR ELECTRONIC DEVICES". The Provisional Patent Application, Ser. No. 60/444,269 filed Jan, 31, 2003, and entitled "REMEDIES FOR FREEZING IN CLOSED-LOOP LIQUID COOLING FOR ELECTRONIC DEVICES" is also hereby incorporated by reference.

FIELD OF THE INVENTION

The invention relates to an apparatus for securing components of a cooling system in general, and specifically, to a decoupled spring-loaded mounting apparatus and method of manufacturing thereof.

BACKGROUND OF THE INVENTION

Closed fluid loops are used in cooling electronic devices, such as microprocessors in a computer. The fluid loop includes a heat exchanger which is placed in contact with the microprocessor as well as a heat rejector and pump coupled to the heat exchanger by one or more fluid tubes. FIG. 1 illustrates an existing fluid loop assembly 10. As shown in FIG. 1, the assembly 10 includes the heat exchanger 12 having a protruding tongue 14 and a pair of attach legs 20 extending from the body of the heat exchanger 12. In addition, the assembly 10 includes a substantially larger heat rejector 16 that is coupled to the heat exchanger 12 by three fluid tubes 18, whereby the heat rejector 16 includes a pair of attach legs 24 extending therefrom. The components in the assembly 10 are rigidly connected to one another to form one rigid assembly 10. As shown in FIG. 1, the microprocessor 26 is attached to a printed circuit board 22 by conventional means. The heat exchanger 12 of the assembly 10 is placed in contact with the microprocessor 26 and secured thereto by inserting the tongue 14 under a retaining member 28 and screwing the attach legs 20 into the printed circuit board 22 using screws 99. In addition, the attach legs 24 of the heat rejector 16 are also screwed into the printed circuit board 22 using screws 99. The system 10 is thereby rigidly attached to the printed circuit board 22 at several locations 24, 28 with very stiff mounting elements.

Closed loop cooling systems are required to retain fluid and vapor during extended operation. Ordinary flexible tubing made from rubber, silicone, plastics, or other highly-flexible materials are incapable of retaining fluids and vapors for extended periods. To overcome this deficiency, the materials of the tubing and fluidic connections includes metals, ceramics, glasses, and other impermeable materials and structures. Such materials and designs of the tubing and fluidic connections share the characteristic in that they are very stiff and cannot be flexed without cracking the cooling system or damaging the electronic system.

In the event of sudden deceleration, shock or bending force applied to the system or the circuit board 22, the stiff, fixed mounts are subjected to very large concentrated stresses which may crack the circuit board 22 or damage the cooling system. During the assembly process, it is common for the fasteners between the system and the printed circuit board to be applied sequentially. As a result, the cooling system will shift and/or tilt some amount of distance at various moments during the assembly process, thereby causing the gap between the microprocessor and the heat exchanger to increase momentarily. Additionally, during the process of attaching the cooling system 10 to the circuit board 22, dimensional tolerances in the components may lead to slightly bent or misaligned components along the circuit board 22. In this case, the stiff mounting structures will lead to very large concentrated stresses between the components that might damage the mounting point, crack the circuit board, or damage the cooling system. These stresses can lead to torque on the heat exchanger element 12 and slight gaps forming between the heat exchanger 12 and the microprocessor 26. The fluid tubes 18 which connect the heat exchanger 12 to the heat rejector 16 are rigid and cannot move independently of one another with respect to the circuit board. In other words, the components of the assembly 10 do not incorporate any tolerance and are not flexible to respond to sudden movements. The stiffness and rigidity of the assembly 10 in FIG. 1 thus makes the assembly 10 susceptible to cracking or breaking whenever the printed circuit board 22 or entire packaging undergoes sudden movements or is dropped. In addition, the inability of the individual components in the assembly 10 to independently move or tolerate movement often causes the heat exchanger 12 to come out of or lose contact with the microprocessor 26 when subjected to sudden movements. Additionally, sudden movements experienced by the assembly 10 may cause the heat grease or thermal interface material between the heat exchanger 12 and microprocessor 26 to move, thereby making the heat exchanger 12 less effective in removing heat from the microprocessor 26. Any of the above scenarios can be detrimental to the electronic device packaging utilizing the closed fluid loop within.

What is needed is an assembly for coupling a closed loop fluid system to a mounting surface in which the individual components are decoupled and able to move independently with respect to one another. What is also needed is an assembly which secures and maintains all necessary interface contacts to retain the integrity of the cooling system. What is also needed is an assembly configured to apply force which is approximately constant and maintains the heat exchanger in consistent contact with the electronic device irrespective of sudden movements are shocks applied to the system.

SUMMARY OF THE INVENTION

One aspect of the invention includes a mounting assembly which secures a heat exchanger that is coupled to a heat source. The mounting assembly comprises at least one support bracket which is positioned at one or more fixed locations with respect to the heat source. The mounting assembly also comprises a clip which is coupled to the support bracket and is configured to resiliently urge the heat exchanger in contact with the heat source. The mounting assembly further comprises at least one bracket which secures the heat rejector and/or pump thereupon, wherein the heat exchanger and heat rejector are independently moveable with respect to one another. In one embodiment, the heat rejector is positioned substantially above the heat exchanger, and in another embodiment, the heat rejector is positioned adjacent to the heat exchanger.

Another aspect of the invention includes a package which has a closed-loop fluid system within. The package comprises a heat exchanger which is coupled to an electronic device at an interface. The package also includes a heat rejector that is coupled to the heat exchanger via at least one fluid tube. A first mount secures the heat exchanger to the electronic device at the interface. A second mount secures the heat rejector thereupon, wherein the first mount and the second mount are independently moveable with respect to each other.

Another aspect of the invention includes a closed loop fluid system which controls a temperature of an electronic device. The system comprises a heat exchanger which is coupled to the electronic device at an interface as well as a heat rejector which is coupled to the heat exchanger via at least one fluid tube. The system also includes a first mount which secures the heat exchanger to the electronic device at the interface and a second mount which secures the heat rejector and/or pump thereupon, wherein the first mount and the second mount are independently moveable with respect to each other.

Another aspect of the invention includes a mounting assembly which is adapted to secure a closed loop cooling system. The closed loop system preferably has a heat exchanger that is in contact with an electronic device, whereby the heat exchanger is coupled to a heat rejector via at least one fluid line. The mounting assembly comprises a first mount. The first mount further comprises at least one substantially vertical member that is coupled to the surface and a flexible feature that is coupled to the at least one substantially vertical member and is configured to press or urge the heat exchanger against the electronic device. The resilient feature applies a substantially constant downward force to the heat exchanger. The mounting assembly further includes a second mount which comprises a platform that is configured to receive the heat rejector. The first mount and the second mount move independently of one another and have a stiffness value that is as least as high as that of the at least one fluid line.

Another aspect of the invention includes a method of securing a closed loop fluid system which is configured to control a temperature of an electronic device coupled to a mounting surface. The closed loop fluid system includes a heat exchanger that is in contact with the electronic device and a heat rejector that is coupled to the heat exchanger via at least one fluid tube. The method comprises the steps of forming a first support bracket structure, coupling the first support bracket structure to the mounting surface and coupling a spring loaded clip to the first support bracket structure, wherein the clip is adapted to secure the heat exchanger to the electronic device. The method further comprises the steps of forming a second support bracket structure which has a second support bracket platform and coupling the second-support bracket structure to the mounting surface, wherein the second support bracket platform is configured to hold the heat rejector thereupon.

In each of the above embodiments, the heat exchanger is coupled to at least one heat rejector and pump via at least one fluid line which has a fluid line stiffness value. The clip has a clip stiffness value greater than the stiffness value of the fluid line in each of the six possible degrees of freedom of the system. The clip is preferably in contact with a top surface of the heat exchanger, whereby the clip applies a downward force to the heat exchanger and consistently urges the heat exchanger in contact with the heat source irrespective of movements at the fixed location.

DETAILED DESCRIPTION OF THE PRESENT INVENTION

It is apparent that although the present invention is described in relation to a cooling system, the present invention is alternatively applied to a heating system. In general, the present invention is directed to a mounting assembly which applies a substantially constant securing force to the heat exchanger, thereby securing the heat exchanger in contact with the heat source. In addition, the securing force remains constant along the interface between the heat exchanger and heat source irrespective of sudden forces and/or movements experienced by the assembly. In addition, the assembly is configured to additionally secure the heat rejector and pump components of the system, thereby allowing the components to be independently moveable or decoupled so that the system is flexible and able to withstand sudden movements. Although the present invention is described in relation to a system for cooling a microprocessor in a computer, it should be noted that the present invention can be used with systems which cool other electronic devices or circuits.

Figure 1:
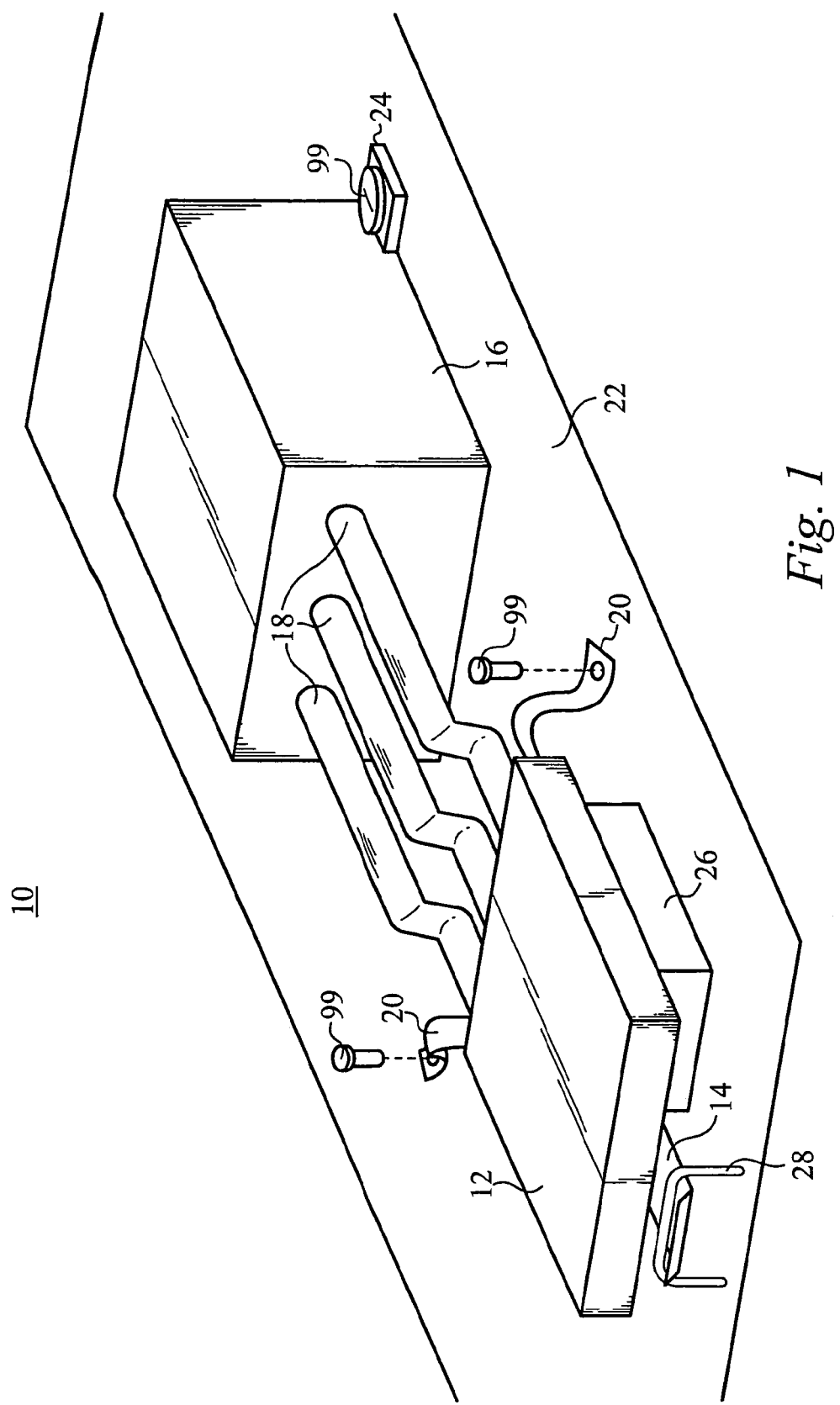
FIG. 1 illustrates a perspective view of a prior art closed loop fluid system assembly.
Figure 2A:
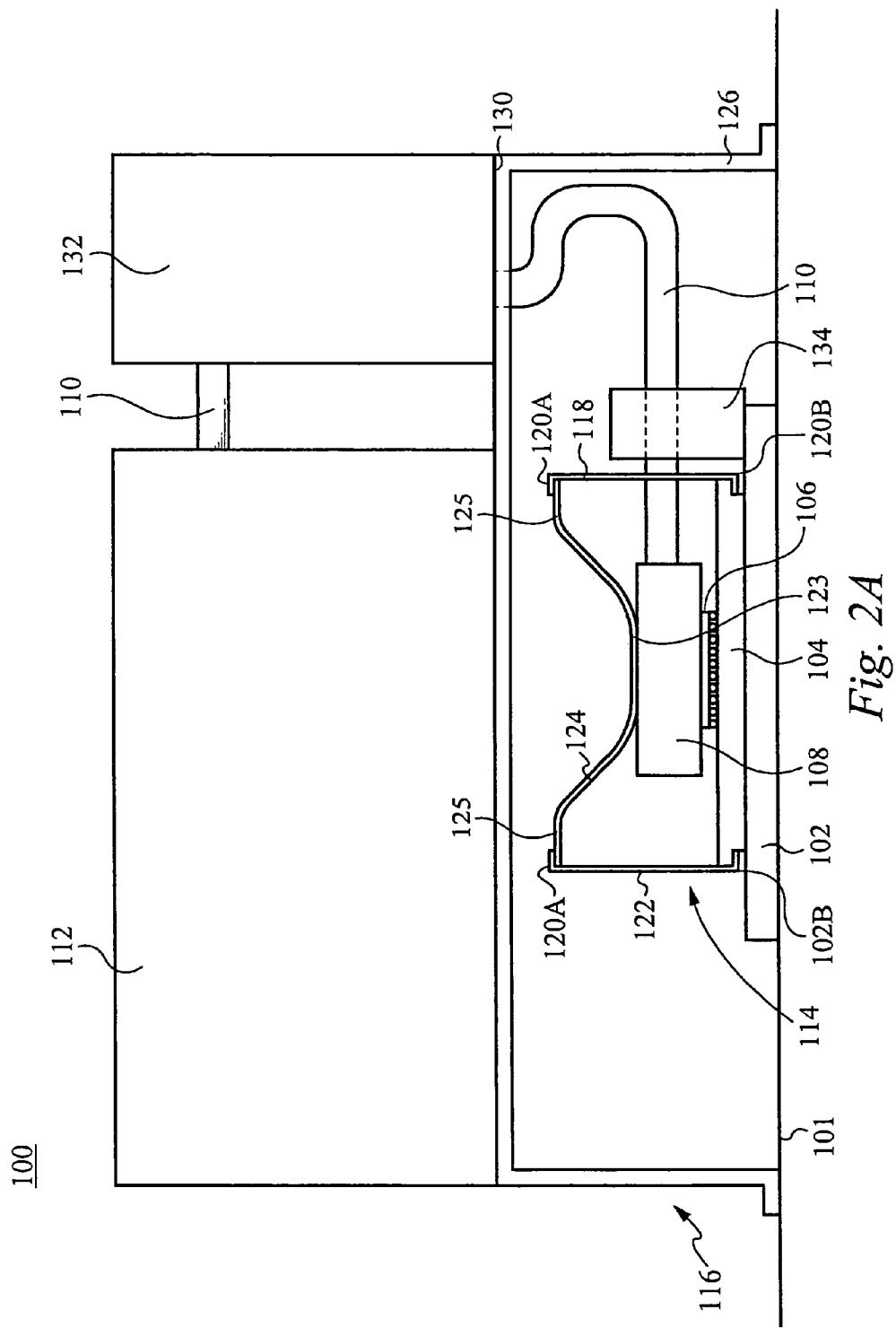
FIG. 2A illustrates a schematic of the preferred embodiment of the mounting assembly in accordance with the present invention.
Figure 2B:
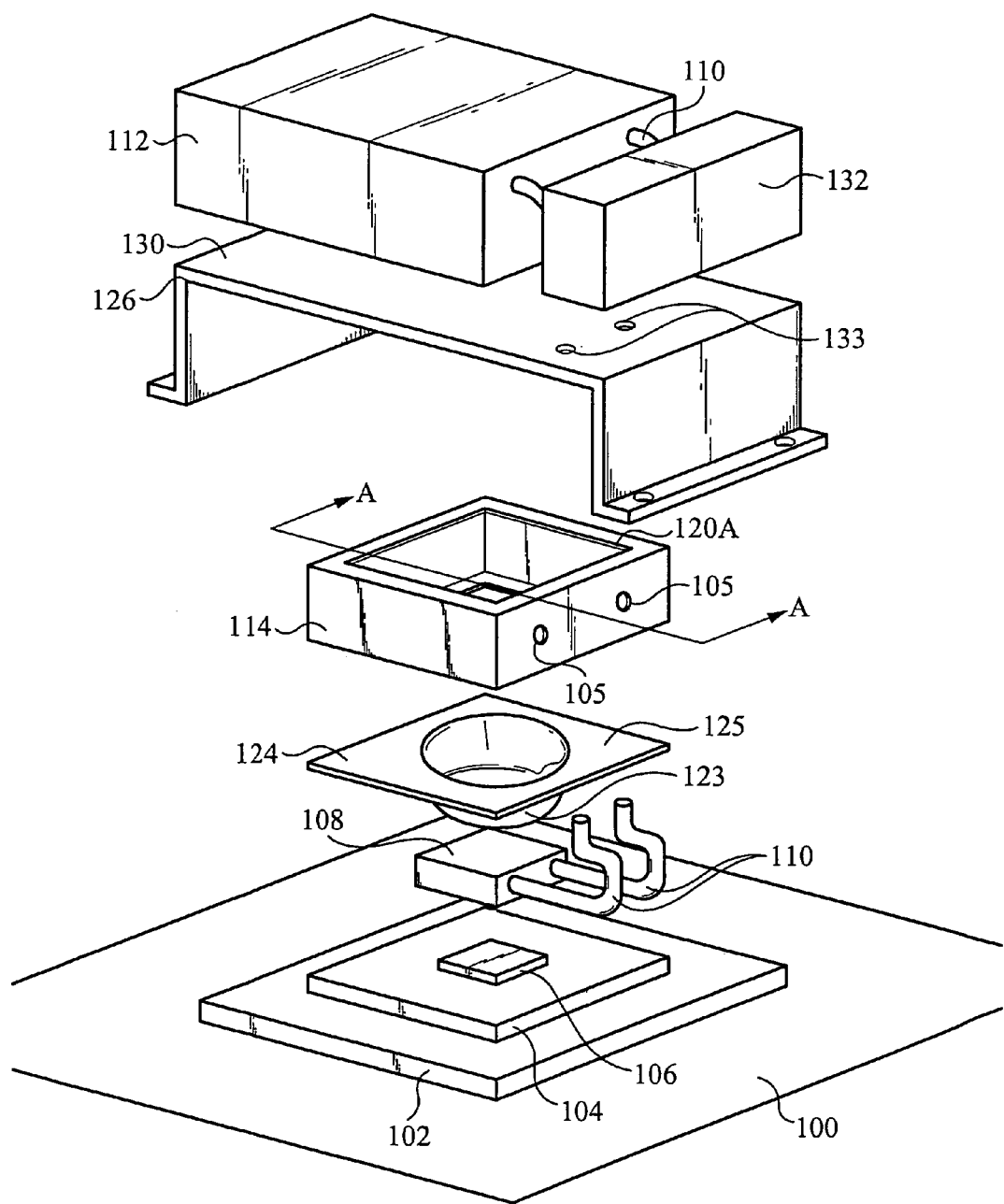
FIG. 2B illustrates an exploded view of the preferred mounting assembly in accordance with the present invention.

FIG. 2A illustrates a schematic of the preferred embodiment of the mounting assembly in accordance with the present invention. FIG. 2B illustrates an exploded view of the preferred mounting assembly in accordance with the present invention. The mounting assembly is preferably contained within an electronics package (e.g. computer), along with the closed loop system. In particular, FIG. 2A illustrates a printed circuit board surface 101 having a socket 102 for receiving and engaging a grid array 104, including but not limited to a pin grid array (PGA), ball grid array (BGA) and land grid array (LGA). The grid array 104 includes an interface for accepting an electronic device such as a microprocessor 106. It should be noted that other known methods and devices to couple the electronic device 106 to the grid array 104 is contemplated by one skilled in the art.

The sealed closed loop system is configured to cool the electronic device 106 or other electronic device. The heat exchanger 108 and electronic device 106 are preferably coupled together with an adhesive or thermal interface material therebetween. The heat exchanger 108 is preferably coupled to the top surface of the electronic device 106 and includes one or more fluid ports which allow fluid to enter and exit the heat exchanger 108 via fluid tubes, couplings or connections 110. It should be noted that any type of appropriate heat exchanger is used in the present cooling system shown in FIG. 2A. The fluid tubes 110 from the heat exchanger 108 are coupled to the heat rejector 112 and pump 132. Alternatively, the fluid tubes 110 are coupled only to the pump 132 or only the heat rejector 112. It should be noted that FIG. 2A only illustrates one fluid tube 100 for clarity purposes, although multiple fluid tubes 110 are preferred and referred to herein. As shown in FIG. 2B, the fluid tubes 110 pass through apertures 105 in the bracket 118 from the heat exchanger 108. In addition, the fluid tubes 110 pass through apertures 133 in the mount bracket 116 to couple the heat exchanger 108 to the pump 132. It should be noted that any type of appropriate heat rejector 112 is used in the present cooling system shown in FIG. 2A. In addition, the system includes a pump 132 which pumps the fluid through the cooling system, whereby the pump 132 is coupled to the heat rejector 112 and heat exchanger 108. Preferably, the pump 132 is an electro-kinetic pump, although any type of pump is contemplated.

Figure 3:
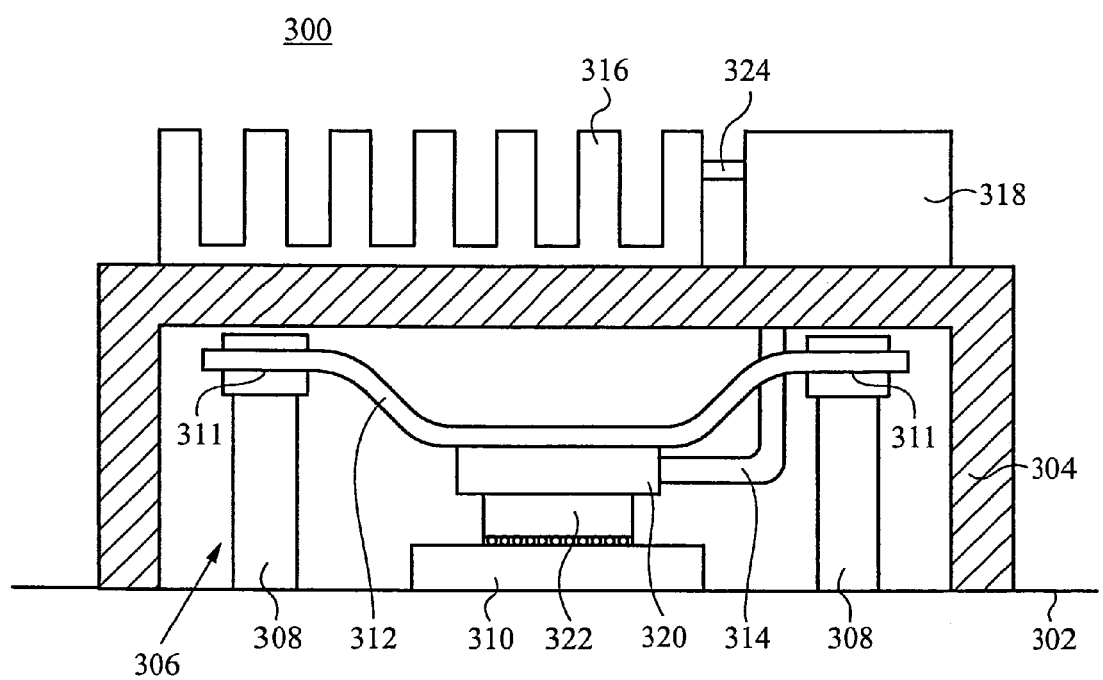
FIG. 3 illustrates a schematic of an alternative embodiment of the mounting assembly in accordance with the present invention.

The heat exchanger 108 is securely held against the top surface of the electronic device 106 by a mounting assembly 114 shown in FIG. 2A. In the preferred embodiment, the mounting assembly 114 includes a bracket 118 as well as a spring loaded clip 124 coupled thereto. The bracket 118 is preferably coupled to a base, such as the grid array 104 as shown in FIG. 2A. It is apparent to one skilled in the art that the base is alternatively any other appropriate surface, such as the printed circuit board 101 itself. The bracket 118 preferably has an upper lip 120A, a lower lip 120B and a vertical wall 122 extending between the upper lip 120A and the lower lip 120B. Preferably, the vertical wall 122 of the bracket 118 substantially surrounds the heat exchanger 108 and electronic device 106 as shown in FIG. 2B. The bracket 118 has a top opening defined as the area in between the upper lips 120A, as well as a bottom opening defined as the area in between the lower lips 120B. The bracket 118 is preferably rectangular shaped, as shown in FIGS. 2A and 2B. Alternatively, the bracket 118 has any other appropriate shape. Alternatively, the bracket 118 includes a number of vertical posts with the clip coupled to each post as shown in FIG. 3.

Referring to FIG. 2A, the lower lip 120B of the bracket 118 preferably fits under the bottom edge of the grid array 104 and extends vertically upward an appropriate distance to compress or energize the clip 124. Thus, the clip 124 is coupled to the bracket 118 by preferably fitting within the area enclosed by the vertical wall 122 of the bracket 118. The clip 124 preferably includes an outer surface 125 as well as a curved or rounded surface 123 which extends from the outer surface 125, as shown in FIGS. 2A and 2B. Alternatively, the clip 124 has any other appropriate shape to perform in the manner consistent with the present invention. The clip 124 is made from one or more of a variety of materials including, but not limited to, stainless steel spring material, spring steel, high Carbon steel, Beryllium-Copper spring material, Phosphor-Bronze spring material, Chrome-Vanadium or Chrome-Silicon alloys.

In the preferred embodiment, the clip 124 is compressed in between the top surface of the heat exchanger 108 and the top lip 120A of the bracket 118. In particular, the outer surface 125 of the clip 124 is coupled to the bracket 118 by fitting underneath the upper lip 120A of the bracket 118 as shown in FIG. 2A. The clip 124 is preferably mechanically coupled to the bracket 118 by screws and fasteners. Alternatively, the clip 124 is coupled to the bracket 118 by brazing, soldering, crimping, applying adhesive or any other coupling method. As shown in FIG. 2A, the semi-circular surface 123 of the clip 124 presses against the top surface of the heat exchanger 108 when the bracket 118 is coupled to the base. In particular, the vertical distance between the outer surface 125 and the curved portion 123 of the clip, in the unloaded pre-assembled state, is greater than the vertical distance between the top surface of the heat exchanger 108 and the upper lip 120A. This difference in vertical distance thus compresses the clip 124 when placed within the bracket 118, wherein the clip 124 is energized by the compression and applies a downward force against the top surface of the heat exchanger 108.

Preferably, a substantial portion of the semi-circular surface 123 applies a consistent force onto the top surface of the heat exchanger 108, whereby the force maintains or urges the heat exchanger 108 securely against the electronic device 106. The clip 124 thus complies to uneven forces by consistently applying a substantially constantly distributed securing force to the heat exchanger 108. The heat exchanger 108 and the electronic device 106 are thus effectively suspended and are held together by a consistent force irrespective of whether the packaging, which houses the assembly 100 and cooling system, is disturbed, dropped, vibrated, turned upside down or sideways, or subjected to any other sudden movements and/or forces.

The clip 124 is made of a spring loaded or other flexible material that has the property of exerting a sufficient, constant force downward onto the heat exchanger 108 at all times, independent of brief displacements or sudden movements. As stated above, during the assembly process, it is common for the fasteners (not shown) between the system and the printed circuit board to be applied sequentially. As a result, the cooling system 100 will shift and/or tilt some amount of distance at various moments during the assembly process, thereby causing the gap between the electronic device 106 and the heat exchanger 108 to increase momentarily. In addition, after assembly, it is possible that the assembly 100 or packaging will briefly shift as a result of some external shock or sudden movement during handling or installation. At the end of these disturbances or movements, the clip 124 urges or maintains the heat exchanger 108 in contact with the electronic device 106 with the same force as before the disturbances had occurred. However, it is preferred that the force exerted by the clip 124 upon the heat exchanger 108 not be significantly larger during the disturbance or movements than before or after the movements occur.

It is preferred that the clip 124 have a modest stiffness and be adequately loaded to provide a substantially constant force upon the heat exchanger 108 which is independent of the displacement to the assembly 100 or packaging. The clip 124 has a spring-like characteristic in which the force applied by the clip 124 is substantially proportional to the compression that the clip 124 undergoes. Similar characteristics are found in springs in which the proportionality constant is called the spring constant or the stiffness valve. In order for the clip 124 to apply a large force over a range of compression as well as undergo significant compression when coupled to the bracket 116, the clip 124 has a modest spring constant or stiffness. As stated above, sudden movements and/or forces can cause small changes in the positions of the components in the assembly 100. The modest stiffness of the clip 124 causes the clip 124 to exhibit small changes in its applied force in response to such small positional changes. Nonetheless, the stiffness of the clip 124 continues to allow the clip 124 to exert the appropriate amount of force onto the heat exchanger 108 to maintain the heat exchanger 108 in contact with the electronic device 106.

The loading force applied by the clip 124 is preferably within the range of and including 1 to 100 pounds or 4.45 to 445 Newton. The advantage of the clip 124 applying a lower force is that the possible damage to the electronic device 106 and/or the interconnect to the substrate is avoided. In contrast, the advantage of the larger force is that the thermal resistance between the electronic device 106 and the heat exchanger 108 is reduced, thereby improving the performance of the cooling system. Typically, displacements of 1 millimeter occur to the components in the assembly during the assembling process or when sudden movements are experienced. However, the clip 124 alternatively has an appropriate stiffness value such that the force applied by the clip 124 varies less than 50% for displacements of 1 mm or more. Accordingly, the stiffness of the clip 124 is preferably less than 200 N/mm. For example, a clip having a stiffness value of 50 N/mm and applying a force of 200 N would have to be loaded or compressed by at least 4 mm during the assembly to operate effectively. In another embodiment, the stiffness of the clip 124 is less than 50 N/mm to allow the clip 124 to provide a consistent force between the electronic device 106 and the heat exchanger 108 for displacements greater than 1 mm. However, a clip having a low-stiffness values will require a significant amount of compression during the assembly process which adds to the complexity of the assembly process and the cost of the structure. It is preferred that the clip 124 is designed to based the cost of the clip, the cost of the assembly process and the uniformity of the loading force over a range of displacements.

For illustration purposes, an alternate, undesirable design would utilize a stiff screw pressed onto the back of the heat exchanger. Since a screw is very stiff along its axis, the loading force applied to the heat exchanger increases very quickly with displacement of the screw. Such a design has an undesirable feature, because the slight adjustments in the rotation of the screw give rise to very large changes in the loading force. In addition, the heat exchanger displacing a very slight amount of distance also give rise to very large forces. Thus, a design utilizing a screw would produce forces that are large enough to crack the electronic device during assembly or handling.

The forces that arise during assembly of the system and sudden movements to the system are mostly transmitted from the pump 132 and heat rejector 112 to the heat exchanger 108 and electronic device 106 along the fluid tubes 110. As discussed above, it is desirable for the spring-loaded clip 124 to exert the appropriate amount of force onto the heat exchanger 108 to maintain thermal contact between the heat exchanger 108 and the electronic device 106. As a result, the spring-loaded clip 124 exerts the desired force onto the heat exchanger 108 to overcome the forces which are transmitted by the fluid tubes 110. In one embodiment, the clip 124 provides a specified pressure to the heat exchanger 108 and maintains the pressure irrespective of sudden movements. In another embodiment, the stiffness of the clip 124 exceeds the stiffness of the fluid tubes 110 to allow some flexibility in the tubes 110. The stiffness values of the fluid tubes 110, clip 124, and strain relief device 134 (FIG. 2A) are determined based on the type of material used for the respective component by one skilled in the art.

In addition, to reduce the forces exerted on the heat exchanger 108 and electronic device 106 by other components in the cooling system, it is desirable to reduce the stiffness of the fluid tubes 110 themselves. The stiffness of the fluid tubes 1110 are reduced in a number of ways, including but not limited to, increasing the length of the tubes 110, reducing the tube 110 wall thickness and diameter, and introducing bends into the path of the tubes 110, as shown in FIG. 2A. In particular, as shown in FIG. 2A, fluid tube 110 extends from the heat exchanger 108 out through the opening 105 (FIG. 2B) in the bracket 118 and preferably has three 90-degree turns to form a "S" configuration. The bends in the fluid lines 110 exerts small forces upon the heat exchanger when the pump 132 and the rejector 112 undergo displacements. This is due to the tube 110 being more flexible upon all six axes and utilizing the six degrees of freedom. In other words, the bends in the fluid tube 110 absorb much of the movement caused by the components and contain the forces to the fluid tube 110 instead of transmitting the forces to the heat exchanger 108. It should be noted that although the fluid tube 110 has three bends, the fluid tube 110 alternatively has any number bends.

Alternatively, it is possible to reduce the transmission of forces from the pump 132 and heat rejector 112 along the fluid tube 110 by utilizing a strain relief structure 134 as shown in FIG. 2A. The strain relief structure 134 is stiff and rigid, whereby the strain relief structure 134 anchors a portion of the fluid tube 110 to the circuit board 101. In particular, the fluid tube 110 extends through the strain relief structure 134, whereby a small portion of the fluid tube 110 extends to the heat exchanger 108 and the remaining portion extends to the pump 132 and rejector 112. The strain relief structure 134 is positioned close to the heat exchanger 108, whereby the amount of the fluid tube 110 between the strain relief structure 134 and the heat exchanger 108 is relatively small compared to the amount of tube 110 between the structure 134 and the pump 132. It should be noted that although the strain relief structure 134 is shown positioned adjacent to the bracket 118, the structure 134 is alternatively positioned anywhere else along the length of the fluid tube 110. The relief structure 134 is preferably made of an appropriate material which has a stiffness value greater than the stiffness value of the fluid lines 110. Thus, the stiffness of the relief structure 134 restrains movement of the smaller portion of the fluid lines 110. The strain relief structure 134 thereby reduces the stress, strain and torsion forces that can be exerted upon the heat exchanger 108 via the fluid tubes 110, because the smaller distance portion of the fluid tubes 110 is between the strain relief structure 134 and the heat exchanger 108 is restrained from moving. With the strain relief structure 134 in place, the design requirements for the lower-stiffness, spring-loaded clip 124 are relaxed, and it is possible to utilize a stiffer clip 124 with less compression. The use of the strain relief device 134 offers reduced cost and easier assembly of the mounting assembly 100.

As shown in FIGS. 2A–2B, the assembly 100 of the present invention also includes a mount bracket 116 which is configured to hold the other component or components in the system independently of the mounting assembly 114. Although one mount bracket 116 is shown in FIGS. 2A–2B, it is apparent to those skilled in the art that multiple mount brackets 116 are alternatively used. The mount bracket 116 includes a platform 130 which preferably holds the heat rejector 112 and pump 132 thereupon. Alternatively, the mount bracket 116 only holds either the heat rejector 112 or the pump 132 thereupon. The mount bracket 116 preferably includes a plurality of screw holes 132 in the legs 128 which allow the mount bracket 116 to be coupled to the printed circuit board 106 or to the external chassis. It is apparent to one skilled in the art that the mount bracket 116 alternatively has any other appropriate coupling mechanism and is not limited to screw holes. The mount bracket 116 preferably holds the heat rejector 112 above the mounting assembly 114 to make efficient use of the printed circuit board 101 space. Alternatively, the mount bracket 116 is positioned adjacent to the mounting assembly 114. The mount bracket 116 is made of a material having sufficient rigidity and stiffness to hold the heat rejector 112 and pump 132 above the heat exchanger 108 without applying a significant amount of force to the fluid tubes 110. In other words, the mount bracket 116 has sufficient rigidity to prevent any force from being applied to the fluid tubes 110 and the mounting assembly 114 in response to sudden movements experienced by the system assembly.

The entire assembly 100 of the present invention is formed using the one or more mounting assemblies 114 and mount brackets 116 coupled to the one or more fixed locations. The heat exchanger 108 and electronic device 104 are thus supported by the mounting assembly 114 which is independently suspended from the mount bracket 116 which supports the heat rejector 112 and pump 132. In other words, the mounts of the system 100 independently supports the heat exchanger 108 and the electronic device 106 as well as the heat rejector 112 and pump 132. The mounting assembly 114 creates a controlled interface force between the heat exchanger 108 and the electronic device 106 without applying any additional force to the heat rejector 112, pump 132 and fluid lines 110. Similarly, the mount bracket 116 applies a separate force to hold and secure the heat rejector 112 in place without applying any additional force or pressure to the heat exchanger 108 and electronic device 106 as well as the fluid lines 110. Therefore, the heat exchanger 108 and electronic device 106 are independently moveable from the heat rejector 112 and the pump 132.

FIG. 3 illustrates a schematic of an alternative embodiment of the mounting assembly 300 in accordance with the present invention. The mounting assembly system 300 shown in FIG. 3 includes a mount bracket 304 which is coupled to a mounting surface 302, such as a printed circuit board, whereby the mount bracket 304 secures the heat rejector 316 and pump 318 above the heat exchanger 320. As shown in FIG. 3, the heat rejector 316 and pump 318 are placed on top of the heat rejector mount 304. In addition, the system 300 includes a mounting assembly 306 which includes vertical posts 308 which are also coupled to the mounting surface 302. The heat exchanger 320 is coupled to the electronic device 322, whereby the electronic device 322 is coupled to the grid array 310. The vertical posts 308 each include an engaging port 311 which is configured to receive the clip 312 and engage the clip 312 thereto. The clip 312 applies a securing force to the interface between the heat exchanger 320 and the electronic device 322 when coupled to the vertical posts 308. The mounting assembly 306 is not rigidly coupled to the mount bracket 304, although the fluid lines 314 couple the heat exchanger 320 to the heat rejector 316 and pump 318. The alternative system 300 shown in FIG. 3 operates in the same manner as the preferred system 100 in FIGS. 2A–2B and is not discussed in more detail herein. It should be noted that the system alternatively has any other appropriate configuration or design which provides a consistent force to the interface between the heat exchanger and the electronic device which is not affected by sudden movements which may cause the heat rejector and/or pump to move.

Figure 4:
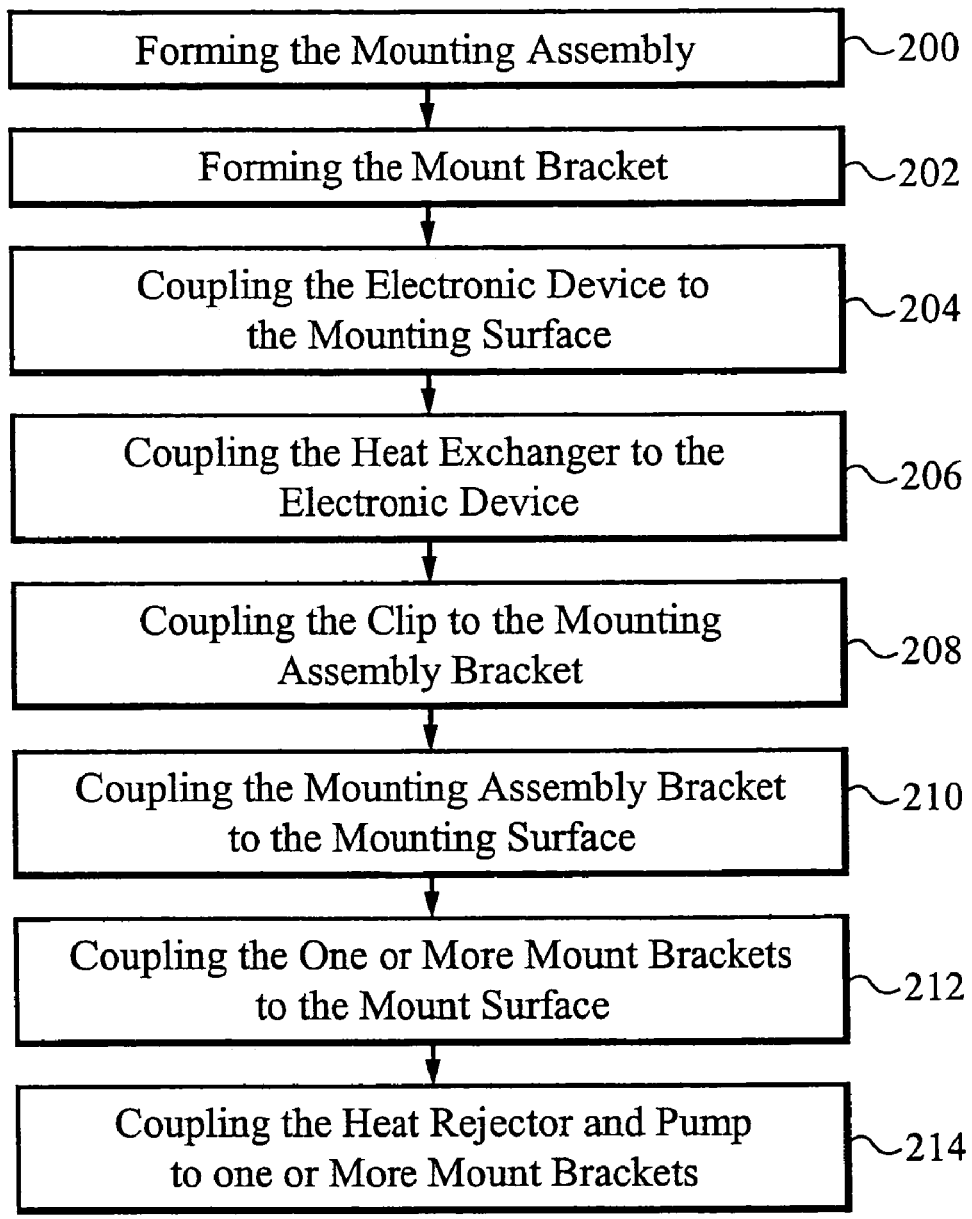
FIG. 4 illustrates a flow chart of the method of mounting the closed loop fluid system within the package in accordance with the present invention.

FIG. 4 illustrates a flow chart of the preferred method of manufacturing the mounting assembly system with the closed loop fluid system in accordance with the present invention. The mounting assembly 114 and mount bracket 116 are formed (steps 200 and 202) using a variety of known methods, including but not limited to, stamping or bending of sheet metal, machining, extrusion, die-casting of zinc, aluminum or magnesium, and forging. The mounting assembly 114 and mount bracket 116 are preferably manufactured separately, whereby the components are attached to the mounting surface(s) separately. Alternatively, the mounting assembly 114 and mount bracket 116 are manufactured and are attached to the mounting surface(s) as one mounting system, wherein the mounting assembly 114 and mount bracket 116 are independently suspended and moveable with respect to one another.

As stated above, the grid array 104 is coupled to the socket 102 in the printed circuit board 101 whereby the electronic device 106 is coupled to the grid array 104 (step 204). Preferably, the heat exchanger 108 is placed in contact with the electronic device 106 as in step 206 (FIG. 2B). It is apparent to one skilled in the art that an intermediate material such as a thermal interface material, heat spreader or any other appropriate material is alternatively applied in between the heat exchanger 108 and electronic device 106. The appropriate amount of intermediate material that is placed in between the heat exchanger 108 and electronic device 106 depends on the heat transfer capabilities and adhesive strength of the intermediate material as well as the amount securing force applied to the heat exchanger by the clip 124. For example, a less amount of thermal interface material may be applied in between the heat exchanger 108 and electronic device 106 in which the amount of force applied by the clip 124 is higher than another clip (not shown).

Following, the clip 124 is coupled to the bracket 118 as in step 208 (FIG. 2B). As stated above, the outer edge of the clip 124 is placed in contact with the underside of the upper lip 120A. The bracket 118 of the mounting assembly 114 along with the clip 124 is coupled to the grid array. 104 or other mounting surface in step 210 (FIG. 2B). In particular, the lower lip 120B of the bracket 118 is snapped under the extending ledge of the grid array 104, as in FIG. 2A. Alternatively, an adhesive is applied between the lower lip 120B and the ledge of the grid array 104 to securely couple the bracket 118 to the grid array 104. The semi circular portion 123 of the clip 124 is then preferably in contact with the top surface of the heat exchanger 108. As stated above, the dimensions of the clip 124 and bracket 118 are such that the clip 124 is loaded by the compressive forces exerted from the top lip 120A which press the clip 124 against the top surface of the heat exchanger 108. The compressive forces applied to the clip 124 thereby cause the clip to exert a consistent force upon the top surface of the heat exchanger 108.

The fluid tubes 110 which are coupled to the heat exchanger 108 preferably passes through the apertures 105 in the bracket 118, whereby the other end of the fluid tubes 110 are coupled to the pump 132 and heat rejector 112 as shown in FIG. 2B. In particular, the fluid lines 110 preferably extend through the apertures 133 in the surface 130 as shown in FIG. 2B. Alternatively, the fluid lines 110 extend through the bracket 118 and mount bracket 116 through any other apertures or passageways. As stated above, the clip 124 and bracket 118 configuration is not limited to that shown in FIGS. 2A-2B and alternatively has any other appropriate configuration in which the clip 124 applies a substantially constant, consistent force to secure the heat exchanger 108 in contact with the electronic device 106 irrespective of sudden movements.

Following, the mount 116 is coupled to the printed circuit board 106 by any conventional method as in step 212 (FIG. 2B). The heat rejector 112 and the pump 132 is coupled to the mount 116 as in step 214 (FIG. 2B). In one embodiment, the heat rejector 112 and pump 132 are already coupled to one another prior to being coupled to the mount 116. In another embodiment, the heat rejector 112 and the pump 132 are coupled to the mount 116 separately and then coupled to one another. Preferably, the mount 116 is positioned to be over the mounting assembly 114 to reduce the amount of space used by the entire loop assembly 100. Alternatively, the mount 116 is placed adjacent to the mounting assembly 114. As shown in FIG. 2A, the platform 130 of the mount 116 holds the heat rejector 112 thereupon, whereby the heat rejector 112 is preferably held above the mounting assembly 114. In addition, the platform 130 of the mount 116 is alternatively large enough to hold the pump (not shown) of the loop system thereupon. It is apparent to one skilled in the art that the above manufacturing steps are not limited to the order described above and illustrated in FIG. 4 and may be alternatively be manufactured in any other appropriate order.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modification s may be made in the embodiment chosen for illustration without departing from the spirit and scope of the invention.

What is claimed is:

1. A mounting assembly for securing a heat exchanger that is coupled to a heat rejector via at least one fluid line, wherein the at least one fluid line has a fluid line stiffness value, and coupled to a heat source, the mounting assembly comprising:
   a. at least one support bracket positioned at one or more locations with respect to the heat source; and
   b. a clip coupled to the support bracket and configured to resiliently urge the heat exchanger in contact with the heat source, wherein the clip has a clip stiffness value greater than the fluid line stiffness value.

2. The mounting assembly according to claim 1 wherein the clip is spring loaded.

3. The mounting assembly according to claim 1 wherein the clip is in contact with a top surface of the heat exchanger, the clip applying a force to the top surface of the heat exchanger.

4. The mounting assembly according to claim 1 wherein the clip maintains the heat exchanger in contact with the heat source irrespective of external movements.

5. The mounting assembly according to claim 1 further comprising at least one bracket for securing at least the heat rejector thereupon, wherein the heat exchanger and heat rejector are capable of moving with respect to the heat source and independently of each other.

6. The mounting assembly according to claim 5 wherein the at least one bracket secures a pump thereupon, wherein the heat exchanger and the pump are capable of moving moving with respect to the heat source and independently of each other.

7. The mounting assembly according to claim 5 wherein the at least one bracket is positioned substantially above the heat exchanger.

8. The mounting assembly according to claim 5 wherein the at least one bracket is positioned substantially adjacent to the heat exchanger.

9. A package having a closed-loop fluid system within comprising:
   a. a heat exchanger coupled to an electronic device at an interface;
   b. a heat rejector coupled to the heat exchanger via at least one fluid tube, wherein the at least one fluid tube has a first stiffness value;
   c. a first mount for securing the heat exchanger to the electronic device at the interface, the first mount configured to apply a desired pressure upon the heat exchanger; and
   d. a force relief structure coupled to the at least one fluid tube at a desired location with respect to the heat exchanger, wherein, the force relief structure has a relief stiffness value.

10. The package according to claim 9 further comprising a second mount for securing the heat rejector, wherein the first mount and the second mount are independently moveable with respect to each other.

11. The package according to claim 9 wherein the relief stiffness value is greater than the first stiffness value.

12. The package according to claim 9 further comprising a pump coupled to the heat exchanger and heat rejector via the at least one fluid tube.

13. A package having a closed-loop fluid system within comprising:
   a. a heat exchanger coupled to an electronic device at an interface;
   b. a heat rejector coupled to the heat exchanger via at least one fluid tube, wherein the at least one fluid tube has a first stiffness value;
   c. a first mount for securing the heat exchanger to the electronic device at the interface;
   d. a second mount for securing the heat rejector, wherein the first mount and the second mount are independently moveable with respect to each other; and
   e. a force relief structure coupled to the at least one fluid tube at a desired location with respect to the heat exchanger, wherein the force relief structure has a relief stiffness value.

14. The package according to claim 13 wherein the relief stiffness value is greater than the first stiffness value.

15. The package according to claim 13 further comprising a pump coupled to the heat exchanger and heat rejector via the at least one fluid tube.

16. A closed loop fluid system for controlling a temperature of an electronic device comprising:
   a. a heat exchanger coupled to the electronic device at an interface;
   b. a heat rejector coupled to the heat exchanger via at least one fluid tube, wherein the at least one fluid tube has a first stiffness value;
   c. a first mount comprising a spring loaded clip having a second stiffness value greater than the first stiffness value, for securing the heat exchanger to the electronic device at the interface; and
   d. a second mount for securing the heat rejector, wherein the first mount and the second mount are independently moveable with respect to each other.

17. The closed loop fluid system according to claim 16 further comprising a pump coupled to the heat exchanger and heat rejector via the at least one fluid tube.

18. The closed loop fluid system according to claim 16 wherein the second mount is made of a material having the second stiffness value greater than the first stiffness value.

19. The closed loop fluid system according to claim 16 wherein the spring loaded clip is in contact with a top surface of the heat exchanger, wherein the spring loaded clip applies a force on the top surface.

20. The closed loop fluid system according to claim 19 wherein the spring loaded clip applies a substantially constant force to the interface.

21. A mounting assembly adapted for securing a closed loop cooling system having a heat exchanger in contact With an electronic device, the heat exchanger coupled to a heat rejector via at least one fluid line; the mounting assembly comprising:
  a. a first mount further comprising:
    i. at least one substantially vertical member coupled to the surface; and
    ii. a flexible feature coupled to the at least one substantially vertical member and configured to urge the heat exchanger against the electronic device, wherein the flexible feature applies a substantially constant force to the heat exchanger; and
  b. a second mount further comprising a platform configured to receive at least the heat rejector, wherein the first mount and the second mount move independently of one another and have a rigidity value higher than that of the at least one fluid line.

22. A method of securing a closed loop fluid system configured to control a temperature of an electronic device coupled to a mounting surface, the closed loop fluid system including a heat exchanger in contact with the electronic device and a heat rejector coupled to the heat exchanger via at least one fluid tube wherein the at least one fluid tube has a tube stiffness value, the method comprising:
  a. forming a first support bracket structure;
  b. coupling the first support bracket structure to the mounting surface; and
  c. coupling a spring loaded clip to the first support bracket structure, wherein the clip is adapted to secure the heat exchanger to the electronic device, and wherein the spring loaded clip has a clip stiffness value greater than the tube stiffness value.

23. The method according to claim 22 wherein the spring loaded clip applies a substantially constant force upon a top surface of the heat exchanger.

24. A method of securing a closed loop fluid system configured to control a temperature of an electronic device coupled to a mounting surface, the closed loop fluid system including a heat exchanger in contact with the electronic device and a heat rejector coupled to the heat exchanger via at least one fluid tube, the method comprising:
  a. forming a first support bracket structure;
  b. coupling the first support bracket structure to the mounting surface;
  c. coupling a spring loaded clip to the first support bracket structure, wherein the clip is adapted to secure the heat exchanger to the electronic device,
  d. forming a second support bracket structure having a second support bracket platform; and
  e. coupling the second support bracket structure to the mounting surface, wherein the second support bracket platform is configured to hold at least the heat rejector thereupon.

25. The method according to claim 24 wherein the second support bracket platform is positioned substantially above the first support bracket structure.

26. The method according to claim 24 wherein the second support bracket structure is made of a material having a stiffness value greater than that of the at least one fluid tube.

27. The method according to claim 24 wherein the second support bracket structure is made of a material having a stiffness value less than that of the at least one fluid tube.

28. The method according to claim 24 wherein the first support bracket structure and the second support bracket structure are configured to move independently of each other.

29. A mounting assembly for securing a heat exchanger that is coupled to a heat rejector via at least one fluid line, wherein the at least one fluid line has a fluid line stiffness value, and coupled to a heat source, the mounting assembly comprising:
  a. at least one support bracket positioned at one or more locations with respect to the heat source;
  b. a clip coupled to the support bracket and configured to resiliently urge the heat exchanger in contact with the heat source; and
  c. a force relief structure coupled to the at least one fluid line at a desired location with respect to the heat exchanger, wherein the force relief structure has a relief stiffness value.

30. The mounting assembly according to claim 29, wherein the relief stiffness value is greater than the fluid line stiffness value.

31. The mounting assembly according to claim 29, wherein the clip is in contact with a top surface of the heat exchanger, the clip applying a force to the top surface of the heat exchanger.

32. The mounting assembly according to claim 29, wherein the clip maintains the heat exchanger in contact with the heat source irrespective of external movements.

33. The mounting assembly according to claim 29, further comprising at least one bracket for securing at least the heat rejector thereupon, wherein the heat exchanger and heat rejector are capable of moving with respect to the heat source and independently of each other.

34. The mounting assembly according to claim 33, wherein the at least one bracket secures a pump thereupon, wherein the heat exchanger and the pump are capable of moving with respect to the heat source and independently of each other.

35. The mounting assembly according to claim 33, wherein the at least one bracket is positioned substantially above the heat exchanger.

36. The mounting assembly according to claim 33, wherein the at least one bracket is positioned substantially adjacent to the heat exchanger.

37. A package having a closed-loop fluid system within comprising:
  a. a heat exchanger coupled to an electronic device at an interface;
  b. a heat rejector coupled to the heat exchanger via at least one fluid tube, wherein the at least one fluid tube has a first stiffness value; and
  c. a first mount comprising a resiliently loaded clip having a second stiffness value less than the first stiffness value for securing the heat exchanger to the electronic device at the interface, the first mount configured to apply a desired pressure upon the heat exchanger.

38. The package according to claim 37 wherein the resiliently loaded clip is in contact with a top surface of the heat exchanger, wherein the resiliently loaded clip applies a force on the top surface.

39. The package according to claim 37 wherein the resiliently loaded clip applies a substantially constant force to the interface.

40. The package according to claim 37 further comprising a pump coupled to the heat exchanger and heat rejector via the at least one fluid tube.

41. A package having a closed-loop fluid system within comprising:
  a. a heat exchanger coupled to an electronic device at an interface;
  b. a heat rejector coupled to the heat exchanger via at least one fluid tube, wherein the at least one fluid tube has a first stiffness value;

c. a first mount comprising a spring loaded clip having a second stiffness value greater than the first stiffness value for securing the heat exchanger to the electronic device at the interface; and d. a second mount for securing the heat rejector, wherein the first mount and the second mount are independently moveable with respect to each other.

42. The package according to claim 41 wherein the spring loaded clip is in contact with a top surface of the heat exchanger, wherein the spring loaded clip applies a force on the top surface.

43. The package according to claim 41 wherein the spring loaded clip applies a substantially constant force to the interface.

44. A method of securing a closed loop fluid system configured to control a temperature of an electronic device coupled to a mounting surface, the closed loop fluid system including a heat exchanger in contact with the electronic device and a heat rejector coupled to the heat exchanger via at least one fluid tube wherein the at least one fluid tube has a tube stiffness value, the method comprising:

a. forming a first support bracket structure;

b. coupling the first support bracket structure to the mounting surface; and c. coupling a spring loaded clip to the first support bracket structure, wherein the clip is adapted to secure the heat exchanger to the electronic device; and d. coupling a force relief structure to the at least one fluid tube at a desired location, wherein the force relief structure has a relief stiffness value.

45. The method according to claim 44 wherein the relief stiffness value is greater than the tube stiffness value.

* * * * *